United States Patent
Ohara et al.

(10) Patent No.: US 12,294,832 B2
(45) Date of Patent: May 6, 2025

(54) MICROELECTROMECHANICAL SYSTEMS DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP); Nisshinbo Micro Devices Inc., Tokyo (JP)

(72) Inventors: Yuki Ohara, Nisshin (JP); Tomoya Joke, Nisshin (JP); Tetsuya Enomoto, Nisshin (JP); Hideo Yamada, Nisshin (JP); Shuji Katakami, Fujimino (JP); Takahide Usui, Fujimino (JP); Hiroyuki Kuchiji, Fujimino (JP); Naoki Masumoto, Fujimino (JP)

(73) Assignees: DENSO CORPORATION, Kariya (CN); TOYOTA JIDOSHA KABUSHIKI KAISHA, Toyota (JP); MIRISE Technologies Corporation, Nisshin (JP); Nisshinbo Micro Devices Inc., Tokyo (JP)

( * ) Notice: Subject to any disclaimer, the term of this patent is extended or adjusted under 35 U.S.C. 154(b) by 107 days.

(21) Appl. No.: 17/843,220

(22) Filed: Jun. 17, 2022

(65) Prior Publication Data
US 2022/0408196 A1    Dec. 22, 2022

(30) Foreign Application Priority Data
Jun. 22, 2021    (JP) .................. 2021-103498

(51) Int. Cl.
| H04R 17/02 | (2006.01) |
| B81B 3/00 | (2006.01) |
| B81C 1/00 | (2006.01) |
| H04R 7/06 | (2006.01) |
| H04R 7/18 | (2006.01) |

(52) U.S. Cl.
CPC .......... *H04R 17/02* (2013.01); *B81B 3/0072* (2013.01); *B81C 1/00666* (2013.01); *H04R 7/06* (2013.01);
(Continued)

(58) Field of Classification Search
CPC ..... B81B 2203/0118; B81B 2203/0127; B81B 3/0072; B81B 2201/0257; B81B 2203/04;
(Continued)

(56) References Cited

U.S. PATENT DOCUMENTS

| 11,516,596 | B2 * | 11/2022 | Lin ........................... H04R 7/18 |
| 2011/0018389 | A1 * | 1/2011 | Fukano ................ H03H 9/1092 |
| | | | 29/25.35 |

(Continued)

FOREIGN PATENT DOCUMENTS

| CN | 208987176 U | * | 6/2019 |
| JP | 2018-137297 A | | 8/2018 |

(Continued)

OTHER PUBLICATIONS

English machine translation of JP-2020178109-A (Kuchiji, Hiroyuki; Piezoelectric Element; published Oct. 2020) (Year: 2020).*

(Continued)

*Primary Examiner* — Mark Fischer
(74) *Attorney, Agent, or Firm* — Posz Law Group, PLC

(57) ABSTRACT

A microelectromechanical systems device includes a vibrator and a reinforcing film. The vibrator includes a piezoelectric element configured to convert pressure to an electrical signal. The reinforcing film is configured to reinforce strength of the vibrator. The vibrator further has a groove at which a portion of the reinforcing film is disposed.

7 Claims, 15 Drawing Sheets

(52) U.S. Cl.
CPC ........ *H04R 7/18* (2013.01); *B81B 2201/0257* (2013.01); *B81B 2203/0127* (2013.01); *B81B 2203/04* (2013.01); *B81C 2201/013* (2013.01); *H04R 2201/003* (2013.01)

(58) Field of Classification Search
CPC . H04R 17/02; H04R 7/06; H04R 7/18; H04R 2201/003; B81C 1/00666; B81C 2201/013
See application file for complete search history.

(56) References Cited

U.S. PATENT DOCUMENTS

| | | | |
|---|---|---|---|
| 2022/0191622 A1 | 6/2022 | Naiki et al. | |
| 2022/0279285 A1* | 9/2022 | Kuchiji | H10N 30/30 |
| 2022/0332568 A1* | 10/2022 | Barsukou | B81B 3/0021 |
| 2023/0349862 A1* | 11/2023 | Zhou | H04R 1/00 |

FOREIGN PATENT DOCUMENTS

| | | | |
|---|---|---|---|
| JP | 2020178109 A | * | 10/2020 |
| JP | 2021197513 A | * | 12/2021 |

OTHER PUBLICATIONS

English machine translation of CN 208987176 U (Luo et al; Piezoelectric film microphone structure; published Jun. 2019) (Year: 2019).*

* cited by examiner

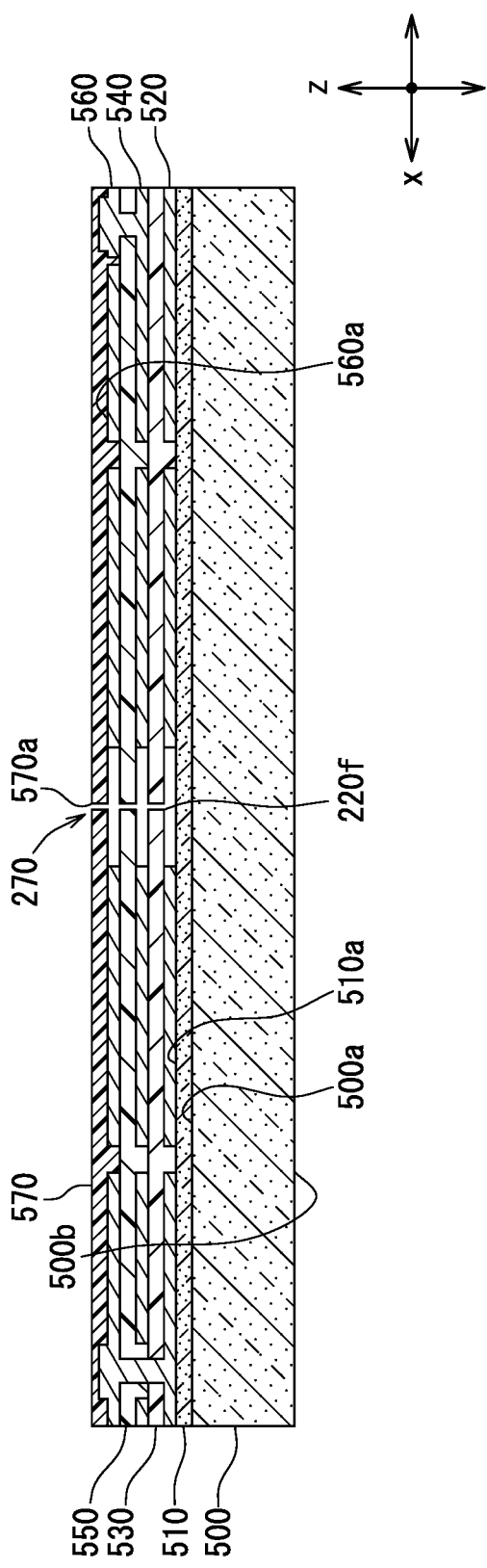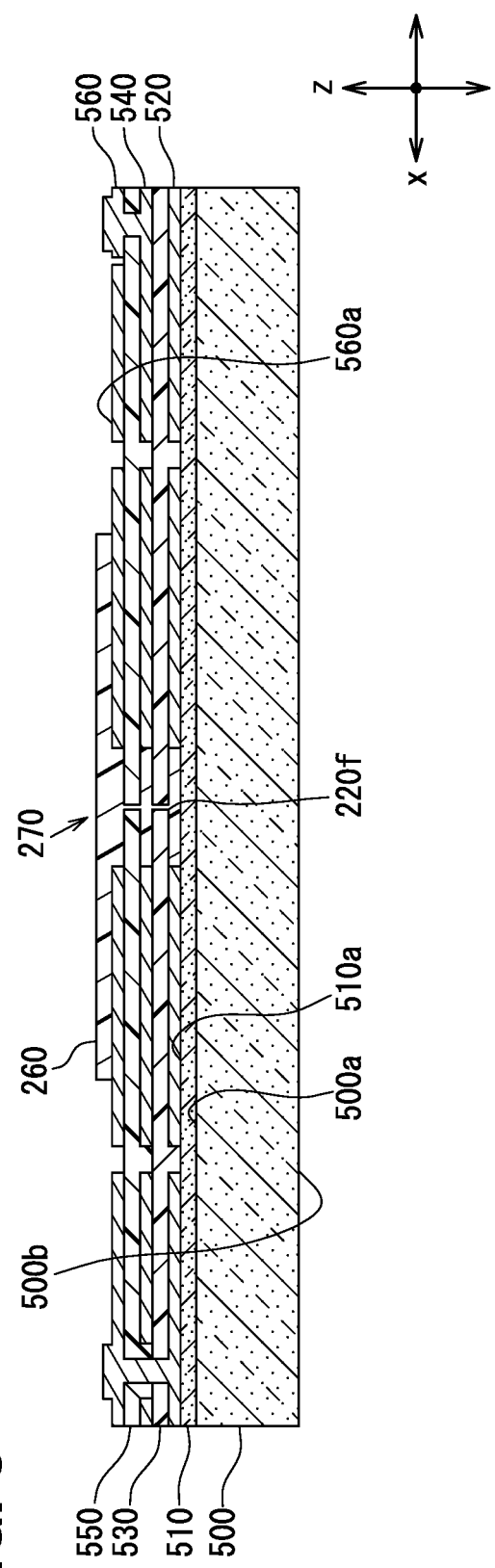

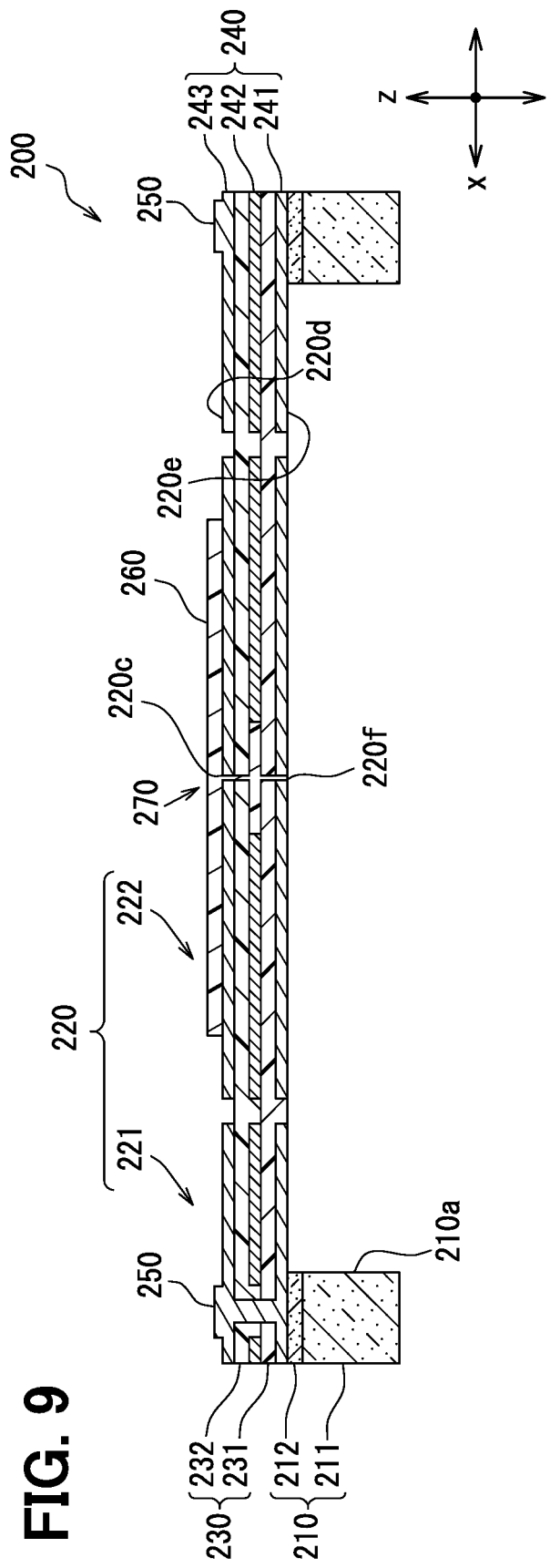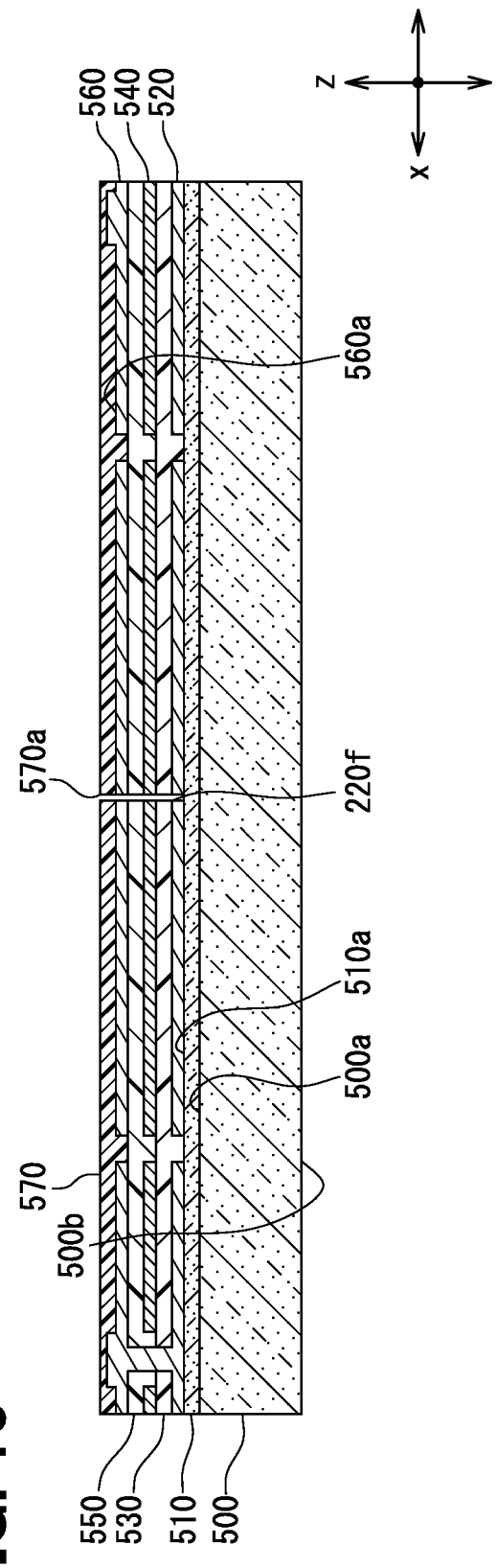

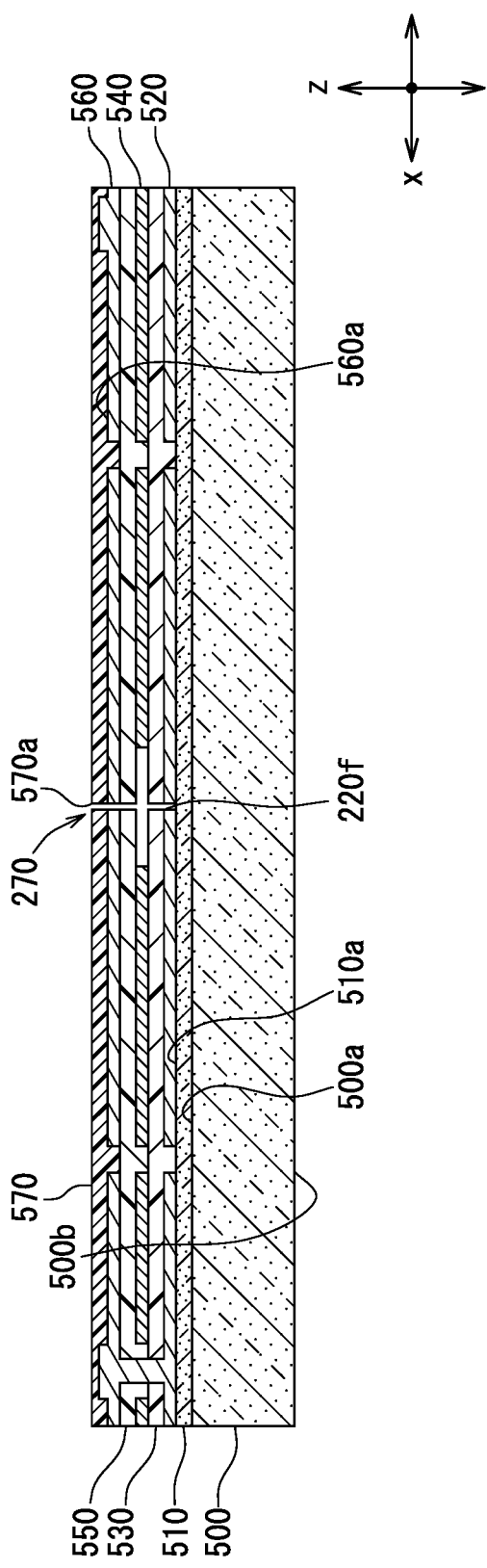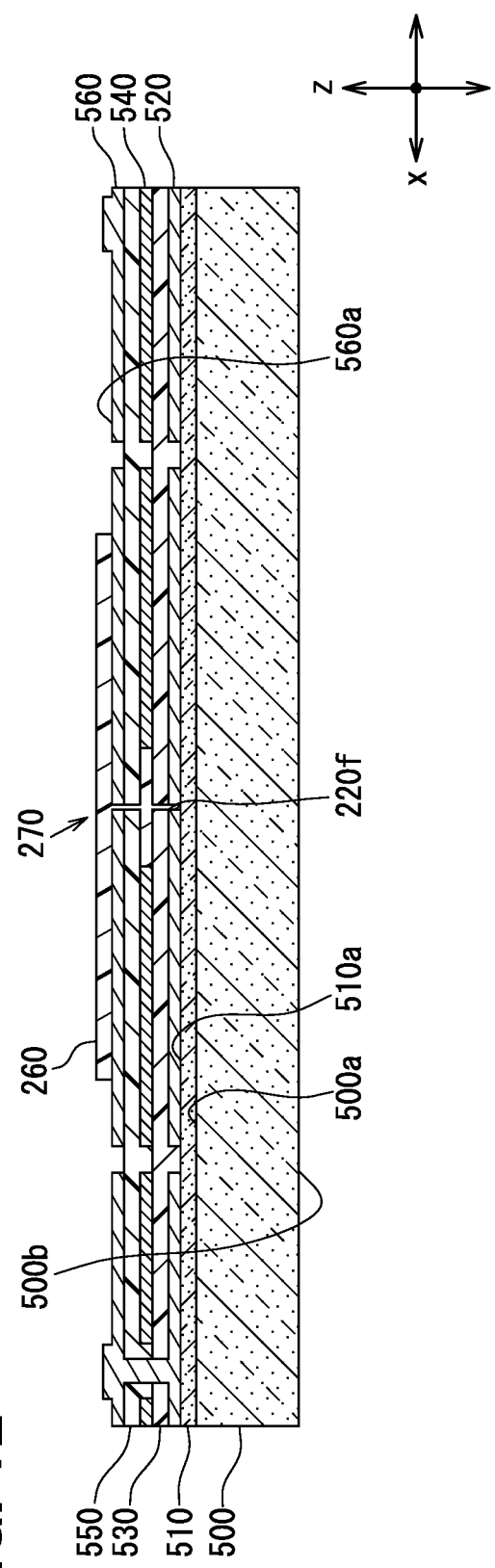

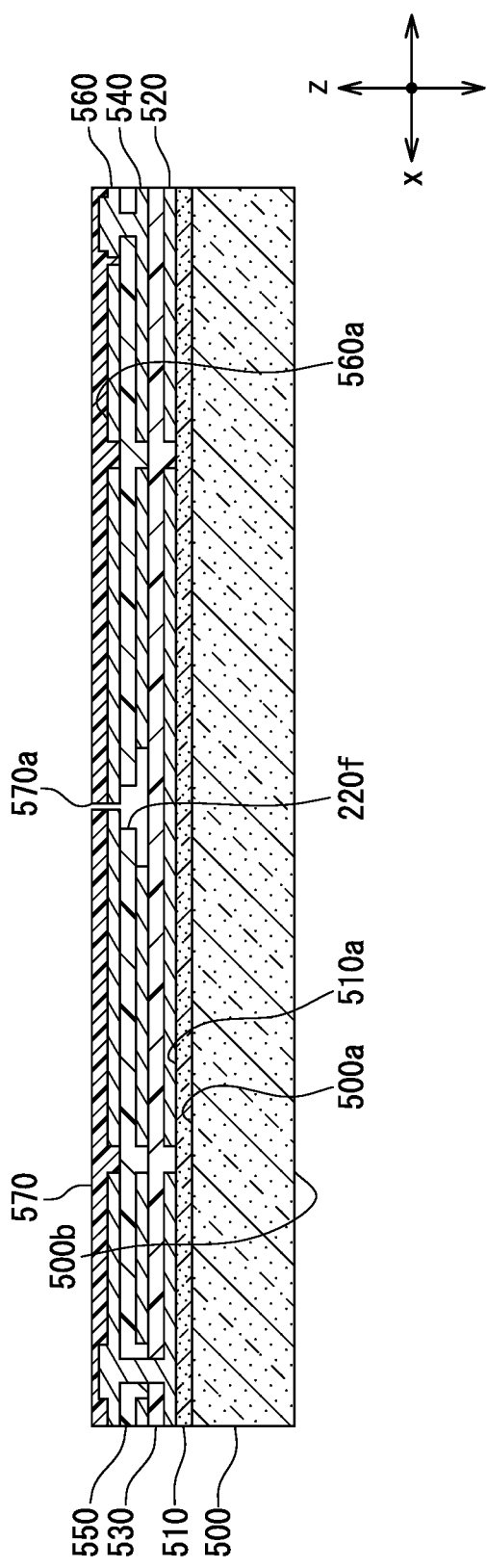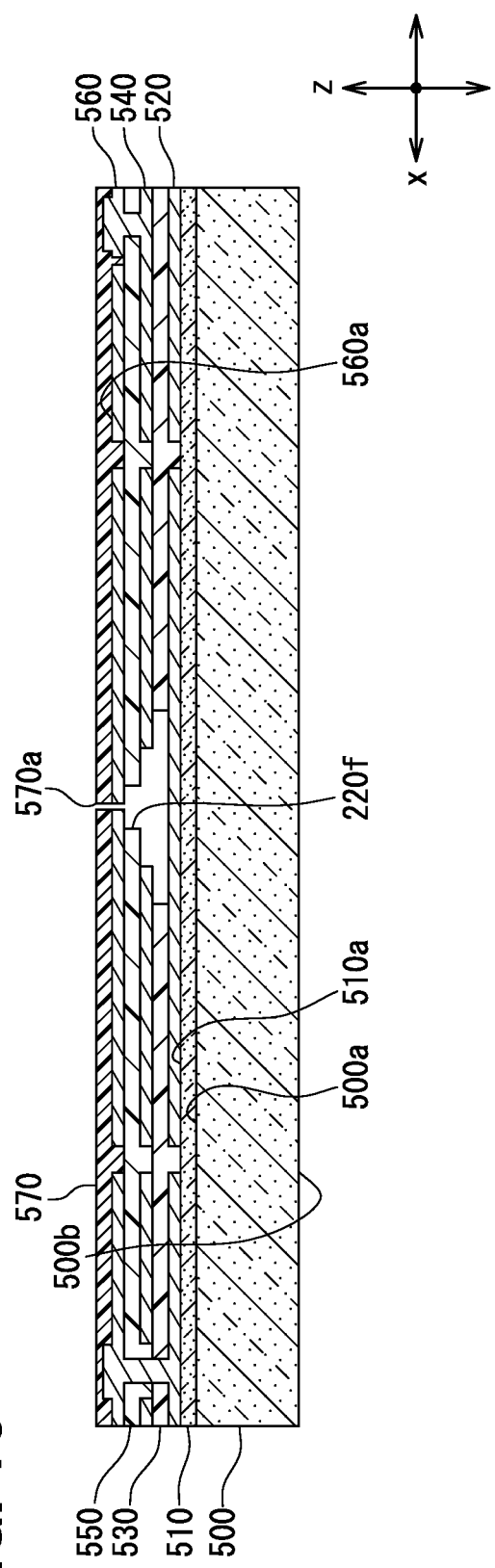

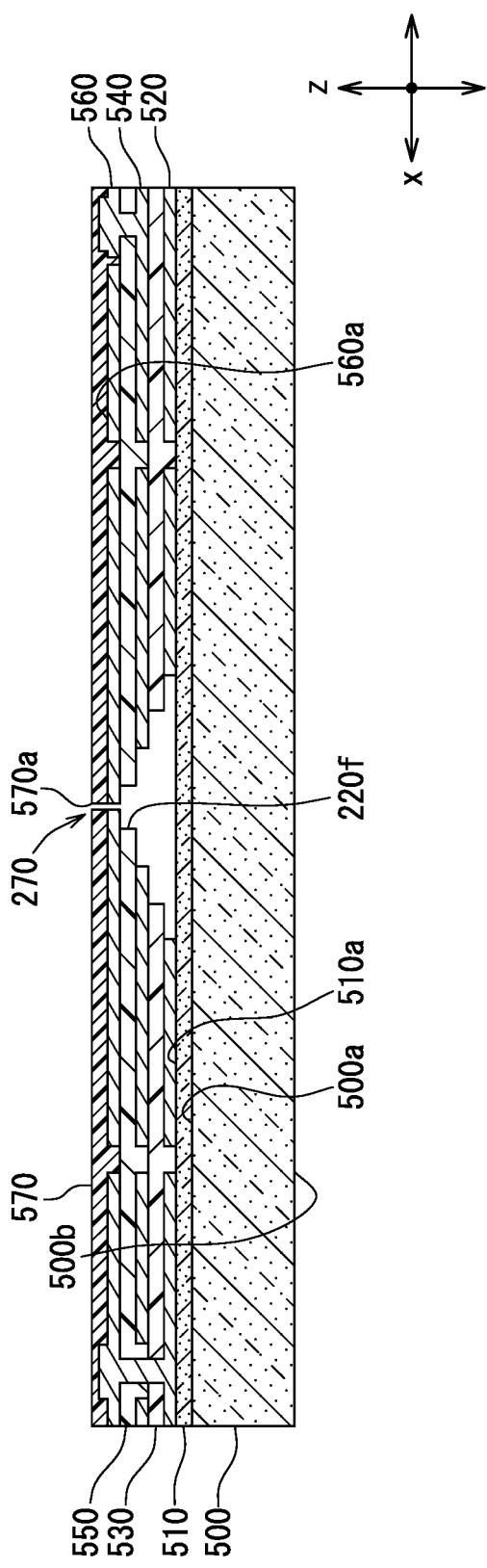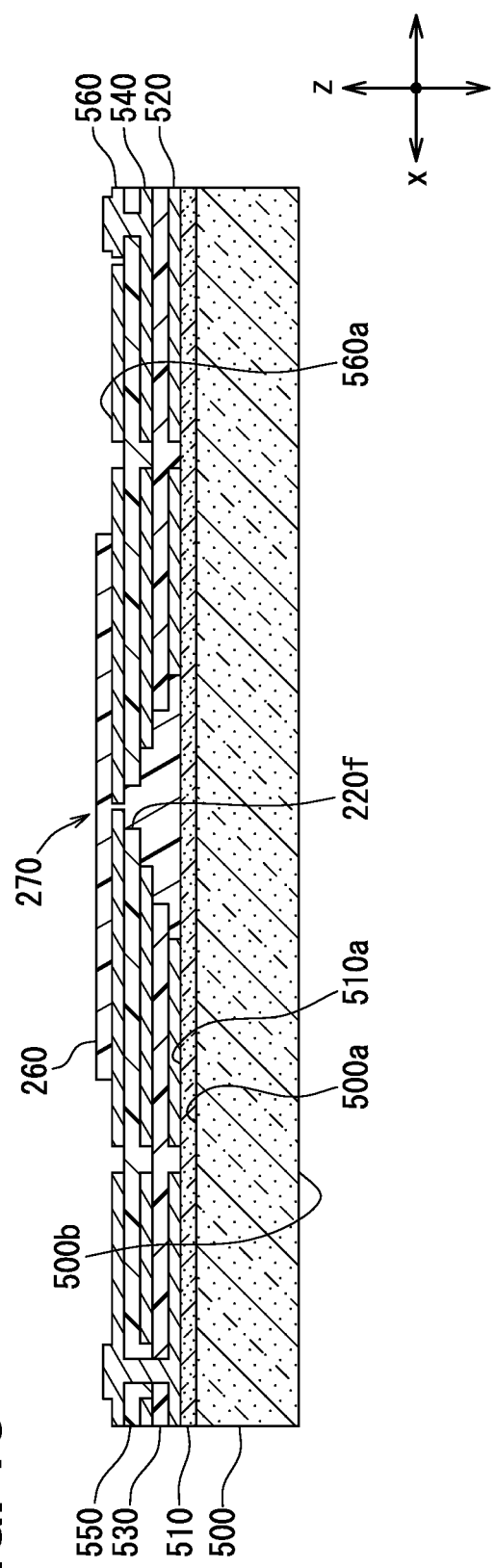

MICROELECTROMECHANICAL SYSTEMS DEVICE

CROSS REFERENCE TO RELATED APPLICATION

This application is based on Japanese Patent Application No. 2021-103498 filed on Jun. 22, 2021, the disclosure of which is incorporated herein by reference.

TECHNICAL FIELD

The present disclosure relates to a microelectromechanical systems (MEMS) device.

BACKGROUND

A piezoelectric MEMS microphone may convert acoustic pressure to a voltage, and may include a diaphragm.

SUMMARY

The present disclosure describes a MEMS device including a vibrator and reinforcing film.

BRIEF DESCRIPTION OF DRAWINGS

Objects, features and advantages of the present disclosure will become more apparent from the following detailed description made with reference to the accompanying drawings. In the drawings:

FIG. 7 is a cross-sectional view of formation of a groove;

FIG. 8 is a cross-sectional view that illustrates formation of a reinforcing film;

FIG. 9 is a cross-sectional view that illustrates etching of a wafer in a second embodiment;

FIG. 10 is a cross-sectional view that illustrates light exposure and etching;

FIG. 11 is a cross-sectional view that illustrates etching of a second electrode thin film;

FIG. 12 is a cross-sectional view that illustrates formation of a reinforcing film;

FIG. 15 is a cross-sectional view that illustrates etching of a second electrode thin film;

FIG. 16 is a cross-sectional view that illustrates etching of a first piezoelectric thin film;

FIG. 17 is a cross-sectional view that illustrates etching of a first electrode thin film;

FIG. 18 is a cross-sectional view that illustrates formation of a reinforcing film;

DETAILED DESCRIPTION

Figure 1:
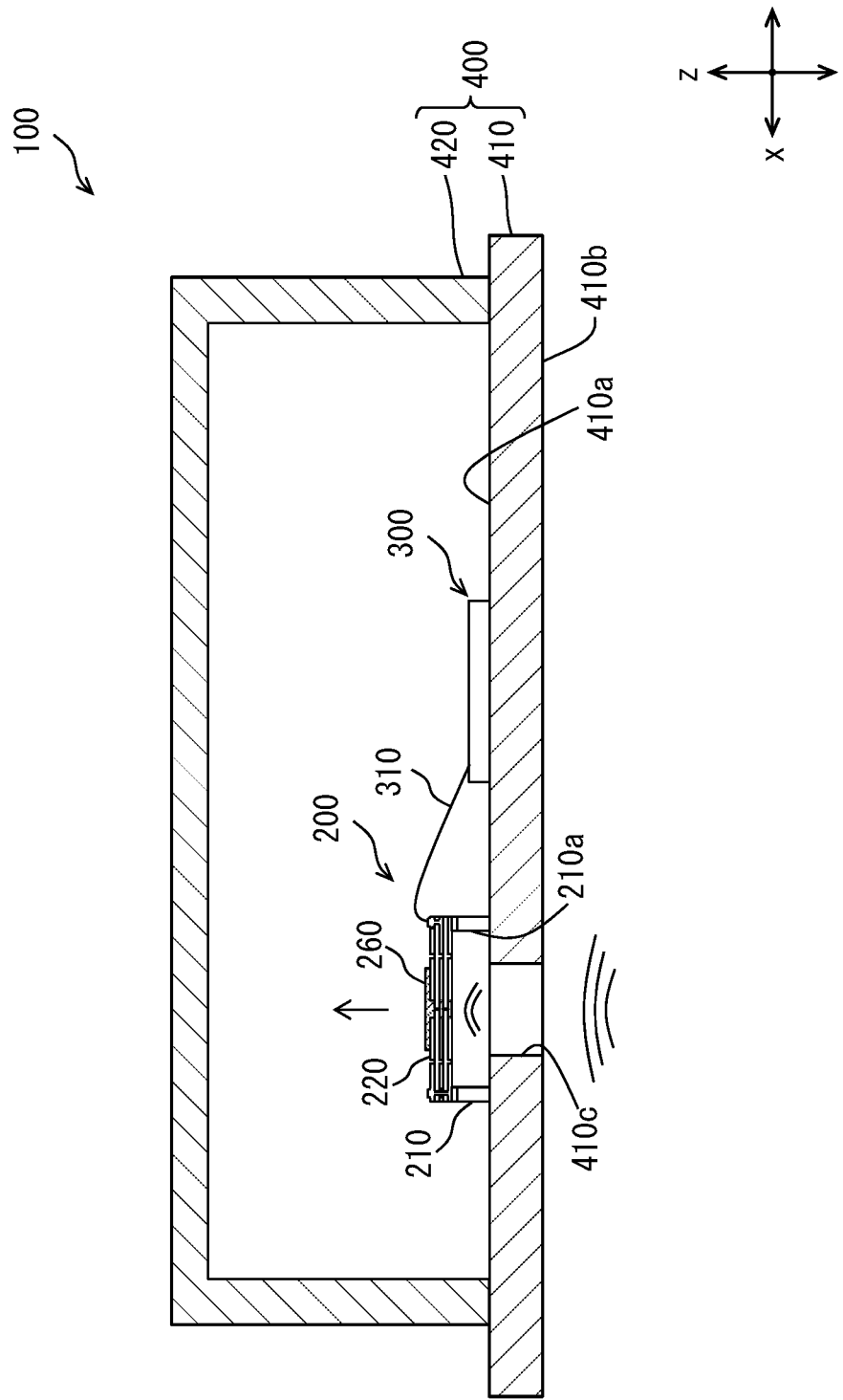
FIG. 1 is a cross-sectional view that illustrates a configuration of a piezoelectric MEMS microphone in a first embodiment.

A diaphragm included in a piezoelectric MEMS microphone may have a cantilever support beam structure. A piezoelectric thin film may be formed at this diaphragm. When the diaphragm vibrates due to acoustic pressure, stress may be exerted on the piezoelectric thin film. A voltage corresponding to this acoustic pressure may be generated in the piezoelectric thin film.

In the piezoelectric MEMS microphone described above, an additional thin film for enhancing elastic modulus may be formed on the diaphragm. However, this additional thin film as a reinforcing film may be peeled off from the diaphragm.

According to an aspect of the present disclosure, a microelectromechanical systems device includes a vibrator and a reinforcing film. The vibrator includes a piezoelectric element that converts pressure to an electrical signal. The reinforcing film reinforces strength of the vibrator. The vibrator further includes a groove at which a portion of the reinforcing film is disposed.

With such a structure described above, it is possible to prevent a situation in which the reinforcing film is peeled off from the vibrator.

The following will describe embodiments for carrying out the present disclosure with reference to the drawings. In each embodiment, parts corresponding to the elements described in the preceding embodiments are denoted by the same reference numerals, and redundant explanation may be omitted. When only a part of the configuration is described in each form, the other forms described above can be applied to the other parts of the configuration.

When, in each embodiment, it is specifically described that combination of parts is possible, the parts can be combined. In a case where any obstacle does not especially occur in combining the parts of the respective embodiments, it is possible to partially combine the embodiments, the embodiment and the modification, or the modifications even when it is not explicitly described that combination is possible.

First Embodiment

The following describes a MEMS device with reference to FIGS. 1 to 8.

(Piezoelectric MEMS Microphone)

A piezoelectric MEMS microphone 100 illustrated in FIG. 1 includes a MEMS device 200, an Application Specific Integrated Circuit (ASIC) 300 and a package 400.

The MEMS device 200 and the ASIC 300 are electrically connected. The package 400 has a substrate 410 and a lid 420. Each of the MEMS device 200 and the ASIC 300 mounts on an inner surface 410a of the substrate 410. The inner surface 410a is covered by the lid 420. The MEMS device 200 and the ASIC 300 are stored in the internal space of the package 400 formed by the substrate 410 and the lid 420.

A feeding hole 410c is formed at the substrate 410. The feeding hole 410c has an aperture that opens to the inner surface 410a and an outer surface 410b at a rear side of the inner surface 410a. The feeding hole 410c communicates with the internal space of the package 400 and the external space of the package 400 located outside the package 400. The aperture at the internal space of the feeding hole 410c is covered by the MEMS device 200.

When air vibration, in other words, sound is generated at the external space, the vibration acts on the MEMS device 200 as acoustic pressure. The MEMS device 200 outputs an electric signal as a voltage corresponding to the acoustic pressure to the ASIC 300. As a result, the sound generated at the external space is detected. The ASIC 300 corresponds to an external device.

(MEMS Device)

The following describes the MEMS device 200. In the following, three directions orthogonal to each other are respectively referred to as an x-direction, a y-direction, and a z-direction.

Figure 2:
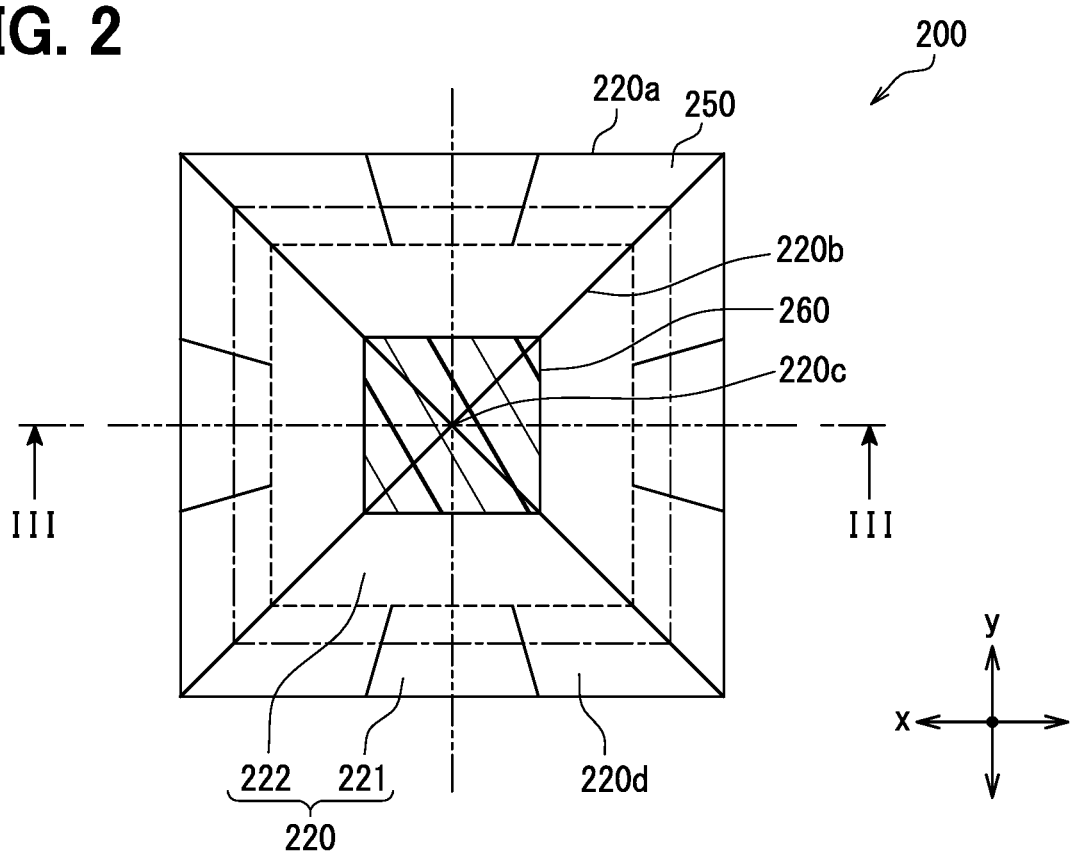
FIG. 2 is a top view of a MEMS device.
Figure 3:
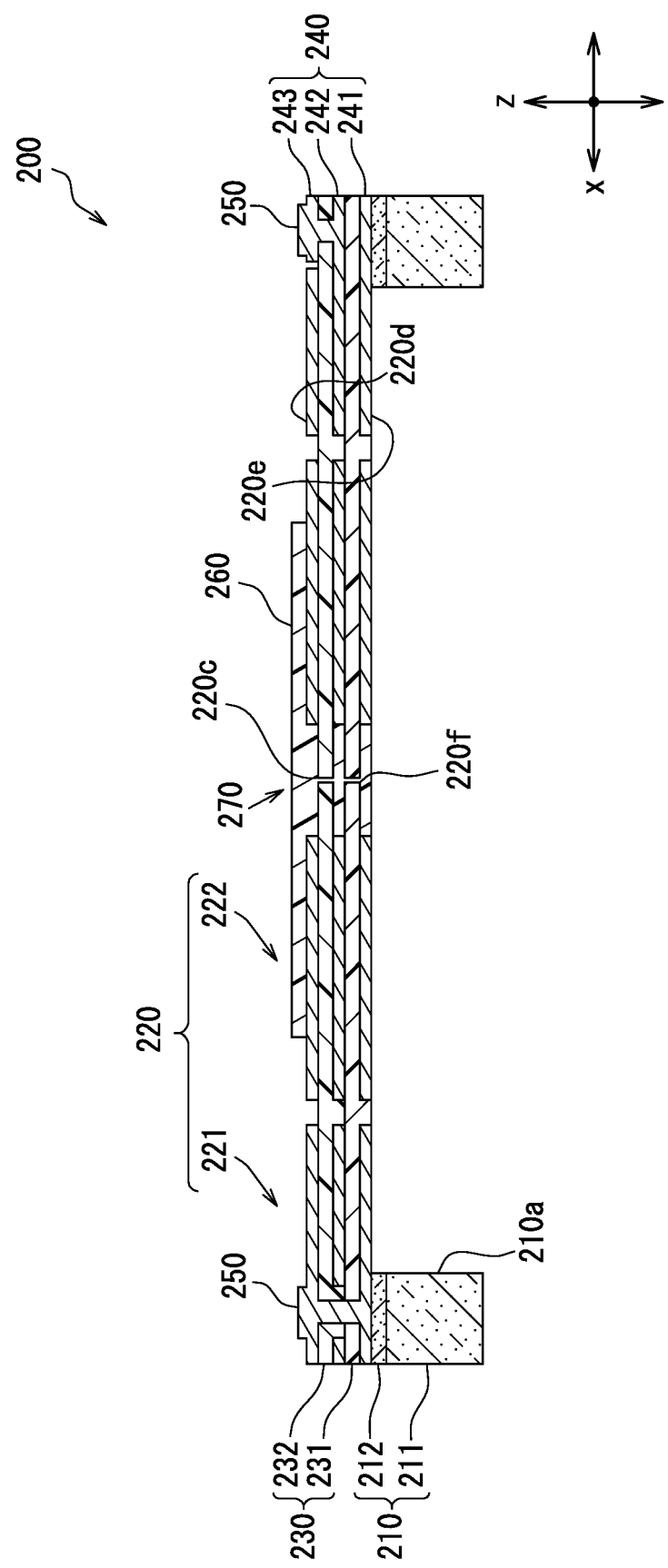
FIG. 3 is a cross-sectional view taken along line III-III of FIG. 2.

As illustrated in FIGS. 2, 3, the MEMS device 200 includes a support base 210 and a vibrator 220. The vibrator 220 is integrally connected to the support base 210.

(Support Base)

The support base 210 includes a base portion 211 and a design layer 212 that are stacked in the z-direction. The base portion 211 is made of silicon. The design layer 212 is made of silicon oxide.

The base portion 211 and the design layer 212 are integrally connected. An opening hole 210a has an aperture in the z-direction, and is formed at each of the base portion 211 and the design layer 212. Each of the base portion 211 and the design layer 212 has a round shape in a circumferential direction around the z-axis.

(Vibrator)

The MEMS device 200 includes multiple vibrators 220. Each of the vibrators 220 may also be referred to as an oscillator or a transducer. Each of the vibrators 220 is integrally connected to the design layer 212 of the support base 210. The vibrators 220 are supported in a cantilever form by the design layer 212. The aperture of the opening hole 210a at a side closer to the design layer 212 is covered by the vibrators 220.

As illustrated in FIG. 2, each of the vibrators 220 has a triangular shape at a plane orthogonal to the z-direction. The vibrator 220 has three sides. One of the three sides as a lower side 220a is fixed to the support base 210. The remaining two sides of the three sides as hypotenuses 220b extend apart from the lower side 220a and intersect to each other to form a tip 220c at the intersection. The tip 220c of each of the vibrators 220 is freed from the support base 210.

In the following, the location around the lower side 220a of the vibrator 220 is referred to as a support end portion 221, and the location around the tip 220c is referred to as a free end portion 222. The free end portion 222 may also be referred to as an open end portion. The direction in which the support end portion 221 and the free end portion 222 are aligned is referred to as an extending direction. In FIG. 2, the boundary between the support end portion 221 and the free end portion 222 is illustrated by a broken line.

The vibrator 220 extends in the extending direction. The vibrator 220 is tapered away from the support base 210. The support end portion 221 included in the vibrator 220 has a trapezoidal shape at a plane orthogonal to the z-direction. The free end portion 222 has a triangular shape at a plane orthogonal to the z-direction. In other words, as viewed from the top of the vibrator 220 illustrated in FIG. 2, the free end portion 222 has a first end and a second end. The support end portion 221 is located at the first end of the free end portion 222, and a tip is formed at the second end of the free end portion 222 such that the free end portion 222 is tapered from the first end to the second end.

The support end portion 221 has the lower side 220a. The upper side that is spaced part in the extending direction from the lower side 220a of the support end portion 221 having the trapezoidal shape is integrally connected to the free end portion 222.

The lower side 220a of the support end portion 221 locates at a projection region of the support base 210 in the z-direction. The upper side of the support end portion 221 locates at a projection region of the opening hole 210a in the z-direction. Each of the lower side 220a and the upper side of the support end portion 221 has a trapezoidal shape at a plane orthogonal to the z-direction.

The upper side of the support end portion 221 locates at a projection region of the opening hole 210a in the z-direction. In FIG. 2, the boundary between a portion at the projection region of the support base 210 of the vibrator 220 in the z-direction and a portion at the projection of the opening hole 210a is illustrated by a dashed-and-dotted line. The dashed-and-dotted line is the boundary between the lower side 220a and the upper side of the support end portion 221.

(Gap)

As illustrated in FIG. 2, the MEMS device 200 has four vibrators 220. These four vibrators 220 are aligned in order in the circumferential direction around the z-direction. Two of these four vibrators 220 are aligned along the x-direction, and remaining two of these four vibrators are aligned along the y-direction. The extending direction of each of the two vibrators 220 aligned along the x-direction intersects the extending direction of each of the two vibrators 220 aligned along the y-direction.

Two vibrators 220 that intersect in the extending direction are aligned side by side in the circumferential direction. One of the two hypotenuses 220b provided by one of the two vibrators 220 and one of the two hypotenuses 220b provided by the other one of the two vibrators 220 are opposed to each other in the circumferential direction through a fine gap. The gap is opened to an upper surface 220d and a lower surface 220e in the z-direction of the vibrator 220. The upper surface 220d and the lower surface 220e are spaced part from each other.

The gap formed among the hypotenuses 220b of the four vibrators 220 aligned in the circumferential direction has a cross mark at a plane orthogonal to the z-direction. The respective tips 220c of the two of the vibrators 220 aligned along the x-direction face each other in the x-direction through the center of the gap formed at the cross mark. The respective tips 220c of the two of the vibrators 220 aligned along the y-direction face each other in the y-direction through the center of the gap formed at the cross mark. The center point of the MEMS device 200 locates at a central axis passing through the center of the gap formed at the cross mark. In FIG. 2, each of two guide lines passing through the center of the cross mark is indicated by a two-dotted line. One of the two guide lines is along the x-direction, and the other one of the two guide lines is along the y-direction.

(Vibration)

The support end portion 221 and the free end portion 222 are included in the vibrator 220. As illustrated in FIGS. 1, 3, a section of the support end portion 221 and the free end portion 222 located at the projection region of the opening hole 210a in the z-direction covers the aperture of the opening hole 210a at a side closer to the design layer 212. The section of each of the support end portion 221 and the free end portion 222 locating at the projection region of the opening hole 210a in the z-direction and the section of the support base 210 dividing the opening hole 210a cover the aperture of the feeding hole 410c at a side closer to the internal space.

With such a structure described above, when the air at the opening hole 210a vibrates due to the sound generated at the external space, the vibration acts on the vibrator 220 as the acoustic pressure. As a result, the support end portion 221 and the free end portion 222 respectively vibrate. Bending occurs at the support end portion 221 and the free end portion 222.

A part of the acoustic pressure escapes to the internal space of the package 400 through the above-mentioned gap. If the gap is wider than a design value, the acoustic pressure easily escapes to the internal space of the package 400. The acoustic pressure causes the vibrator 220 to be difficultly vibrated. The gap is made smaller in order to avoid such a situation.

(Material)

The vibrator 220 includes a piezoelectric element that converts pressure to a voltage. As illustrated in FIG. 3, the vibrator 220 includes a piezoelectric layer 230 and an electrode layer 240. The piezoelectric layer 230 and the electrode layer 240 are stacked in the z-direction. The piezoelectric layer 230 includes piezoelectric material such as aluminum nitride. The electrode layer 240 includes conductive material such as molybdenum. The piezoelectric layer 230 may contain, for example, scandium aluminum nitride (ScAlN) or lead zirconium titanate (PZT).

The piezoelectric layer 230 has a first piezoelectric layer 231 and a second piezoelectric layer 232. The electrode layer 240 has a first electrode layer 241, a second electrode layer 242, and a third electrode layer 243.

As illustrated in FIG. 3, the first electrode layer 241, the first piezoelectric layer 231, the second electrode layer 242, the second piezoelectric layer 232, and the third electrode layer 243 are stacked in order in the z-direction. The first electrode layer 241 is connected to the support base 210. The first electrode layer 241 is located at a side closer to the lower surface 220e of the vibrator 220. The third electrode layer 243 is located at a side closer to an upper surface 220d of the vibrator 220.

The first electrode layer 241 and the second electrode layer 242 are aligned in the z-direction through the first piezoelectric layer 231 to form a lower layer capacitor. The second electrode layer 242 and the third electrode layer 243 are aligned in the z-direction through the second piezoelectric layer 232 to form an upper layer capacitor.

Figure 4:
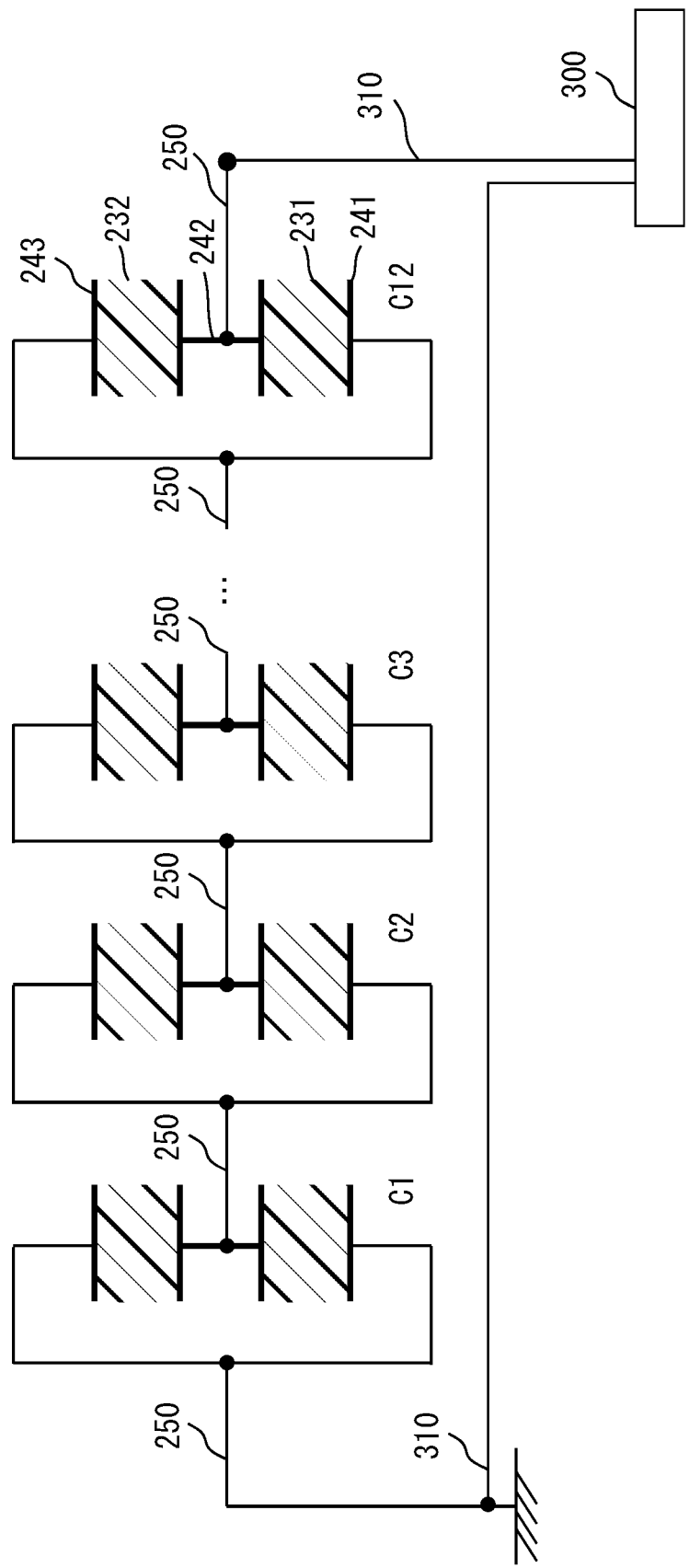
FIG. 4 is a circuit diagram that shows an electrical configuration of a piezoelectric element.

These two capacitors include the second electrode layer 242 as a common configuration element. Two capacitors are electrically connected in series in the z-direction through the common configuration element. As illustrated in FIG. 4, the MEMS device 200 according to the present embodiment includes twelve synthetic capacitors. Each of the synthetic capacitors has two capacitors electrically connected in series.

In FIG. 4, hatching is given to the first piezoelectric layer 231 and the second piezoelectric layer 232. Synthetic capacitors are respectively noted as C1, C2 ... C12. In the following, the synthetic capacitor may also be simply referred to as a capacitor. The number of these capacitors are not limited to twelve.

(Extraction Electrode)

These twelve capacitors are electrically connected to the support end portion 221 of the vibrator 220, and thirteen extraction electrodes 250 are formed at the support end portion 221 of the vibrator 220 to respectively detect voltages at corresponding capacitors. The number of the extraction electrodes 250 is larger than the number of capacitors; however, the number of the extraction electrodes 250 is not limited to thirteen.

Assuming that n is an integer that is equal to larger than two and less than twelve, each of eleven of the thirteen extraction electrodes 250 connects the second electrode layer 242 of the capacitor Cn, and connects the first electrode layer 241 and the third electrode layer 243 of the capacitor Cn+1. As a result, as shown in FIG. 4, the capacitors C1 to C12 are electrically connected in order.

One of the remaining two extraction electrodes 250 is electrically connected to each of the first electrode layer 241 and the third electrode layer 243 of the capacitor C1. The first electrode layer 241 and the third electrode layer 243 are connected to a ground. The last one of the extraction electrodes 250 is connected to the second electrode layer 242 of the capacitor C12. Each of the remaining two extraction electrodes 250 is connected to the ASIC 300 through a wire 310. As a result, the voltage across the twelve capacitors that are electrically connected is output to the ASIC 300.

(Detection of Acoustic Pressure)

The voltage across both ends of the capacitor changes when the vibrator 220 bends due to, for example, acoustic pressure. When the acoustic pressure acts on the vibrator 220, the vibrator 220 vibrates in the z-direction. Tensile stress acts on one of the first piezoelectric layer 231 and the second piezoelectric layer 232, and compressive stress acts on the other.

Due to the difference in the acting stress, voltages having different polarities are respectively generated at the first piezoelectric layer 231 and the second piezoelectric layer 232. The voltage is generated in the electrode layer 240 in each of the above-mentioned capacitors. The total voltage generated by the twelve capacitors is output to the ASIC 300 as a voltage corresponding to the acoustic pressure.

A section of the support end portion 221 is fixed to the support base 210, and the entire free end portion 222 is freed from the support base 210. Due to the difference in such a structure as described above, when the acoustic pressure acts on these configurations, the free end portion 222 has a larger vibration amplitude than the support end portion 221. On the other hand, the free end portion 222 has a smaller stress than the support end portion 221. The vibration amplitude of the support end portion 221 is smaller; however, a larger stress acts on the support end portion 221. Due to the difference in the applied stress, the output of the capacitor formed at a side closer to the support end portion 221 is adopted for detecting the acoustic pressure. The output of the capacitor formed at a side closer to the free end portion 222 is not adopted for detecting the acoustic pressure.

In order to electrically disconnect the capacitor at a side closer to the support end portion 221 and the capacitor at a side closer to the free end portion 222, as shown in FIG. 3, the electrode layer 240 at a side closer to the support end portion 221 and the electrode layer 240 at a side closer to the free end portion 222 are electrically disconnected (insulated). The extraction electrode 250 formed at the support end portion 221 and the electrode layer 240 at the free end portion 222 are electrically disconnected. The capacitor shown in FIG. 4 is a capacitor at a side closer to the support end portion 221.

(Detection Sensitivity)

The detection sensitivity of the acoustic pressure depends on the bending flexibility of the support end portion 221 fixed to the support base 210. The bending flexibility of the support end portion 221 depends on the vibration amplitude of the support end portion 221 with respect to the acoustic pressure. The vibration amplitude of the support end portion 221 rises as the spring constant of the free end portion 222 increases. The spring constant of the free end portion 222 depends on the difficulty in deforming the shape, in other words, the resistance to the deformation of the shape. The difficulty in deforming the shape is reinforced by a reinforcing film 260 as described in the following.

(Reinforcing Film)

For example, as shown by the hatching in FIG. 2, a reinforcing film 260 is formed at each of the vibrators 220. The reinforcing film 260 is made of organic material that has fluidity at the time of forming the reinforcing film 260, and is solidified at the time of the completion of forming the reinforcing film 260.

In addition to the organic material, the material adopted for forming the reinforcing film 260 may have filler for reducing the difference between the linear expansion coefficient of the reinforcing film 260 and the linear expansion coefficient of the vibrator 220. The vibrator 220 includes the piezoelectric layer 230 and the electrode layer 240. The piezoelectric layer 230 is largely included in the vibrator 220 as compared with the electrode layer 240. As the constituent material of the above-mentioned filler, it is possible to adopt material that has the linear expansion coefficient identical to the material adopted for forming the piezoelectric layer 230.

As illustrated in FIG. 3, the reinforcing film 260 is disposed also at the gap among the vibrators 220. In the present embodiment, a single reinforcing film 260 is commonly formed for the four vibrators 220.

As illustrated in FIG. 2, the reinforcing film 260 has a rectangular shape at a plane orthogonal to the z-direction. The reinforcing film 260 is formed at the upper surface 220$d$ of the vibrator 220 at a side closer to the third electrode layer 243. Multiple vibrators 220 are cross-linked by the reinforcing film 260. A portion of the gap formed among the vibrators 220 is closed by the reinforcing film 260.

The reinforcing film 260 is formed at the free end portion 222 of each of the vibrators 220. The tip 220$c$ of each of the vibrators 220 is reinforced by the reinforcing film 260. The tip 220$c$ of each of the vibrators 220 at the gap is covered by the reinforcing film 260.

The vibrators 220 are cross-linked by the reinforcing film 260, and a portion of the gap is covered by the reinforcing film 260. Therefore, each of the vibrators 220 is likely to vibrate in an identical vibration mode. It is difficult for the acoustic pressure to escape into the internal space of the package 400 through the gap. Even though there is such a change, as described above, the free end portion 222 still has a larger vibration amplitude than the support end portion 221, and the stress applied to the free end portion 222 is still smaller than the stress applied to the support end portion 221.

(Side Surface)

The vibrator 220 includes the first electrode layer 241, the first piezoelectric layer 231, the second electrode layer 242, the second piezoelectric layer 232 and the third electrode layer 243. The side surface 220$f$ connected to the hypotenuse 220$b$ is included in the vibrator 220 by the three electrode layers and the two piezoelectric layers. A side surface 220$f$ is located between the upper surface 220$d$ and the lower surface 220$e$ of the vibrator 220 in the z-direction. The side surface 220$f$ connects the upper surface 220$d$ and the lower surface 220$e$. The upper surface 220$d$ corresponds to a front surface. The lower surface 220$e$ corresponds to a rear surface.

The side surface 220$f$ intersects the circumferential direction around the z-direction. One of two side surfaces 220$f$ provided by one of the two vibrators 220 and one of the two side surfaces 220$f$ provided by the other one of the two vibrators 220 are opposed to each other in the circumferential direction through a fine gap. The two vibrators 220 are adjacent to each other and aligned in the circumferential direction. The reinforcing film 260 is provided at each of the two side surfaces 220$f$ that are adjacent to each other and form a gap.

(Groove Portion)

As illustrated in FIG. 3, a groove portion 270 is formed at the side surface 220$f$ of the free end portion 222. A portion of one of the electrode layer and the piezoelectric layer that form the side surface 220$f$ is selectively removed. In a plane orthogonal to the z-direction, one of the portion formed by three electrode layers and one of the portion formed by two piezoelectric layer at the side surface 220$f$ are hollow with respect to the fine gap, in other words, the groove portion 270; and the other one of the portion formed by three electrode layers and one of the portion formed by two piezoelectric layer at the side surface 220$f$ are protruded with respect to the fine gap, in other words, the groove portion 270. The groove portion 270 may also be referred to as a groove.

In the present embodiment, a portion of the electrode layer is selectively removed from the electrode layer and the piezoelectric layer that form the side surface 220$f$. The portion of the side surface 220$f$ formed by the three electrode layers is locally hollow, and the portion of the side surface 220$f$ formed by the two piezoelectric layers is relatively protruded. The uneven groove portion 270 is formed at the side surface 220$f$.

The length of a section of the groove portion 270 increases step-wisely in the direction orthogonal to the z-direction toward the lower surface 220$e$ from the upper surface 220$d$, as viewed locally in the z-direction. The length of the other section of the groove portion 270 decreases step-wisely in the direction orthogonal to the z-direction toward the lower surface 220$e$ from the upper surface 220$d$, as viewed locally in the z-direction.

For example, as illustrated in FIG. 3, a portion of the reinforcing film 260 is formed at the groove portion 270. A section of the reinforcing film 260 is provided at each of the hollow part and protruding part of the groove portion 270. A section of the reinforcing film 260 is connected to the hollow part and the protruding part of the groove portion 270. The hollow part of the groove portion 270 may also be referred to as a recessing part of the groove portion 270.

The reinforcing film 260 does not only extend and spread in the direction orthogonal to the z-direction at the upper surface 220$d$ of the vibrator 220, but also extends in the z-direction at the side surface 220$f$. The portion of the reinforcing film 260 extending in the z-direction extends in a direction orthogonal to the z-direction, and is provided at the groove portion 270.

(Manufacturing Method)

The following describes a method for manufacturing the MEMS device 200 with reference to FIGS. 5 to 8. In the manufacturing method, microfabrication processing such as wet etching and dry etching is performed. The designer may appropriately select any type of etching. In the following, the type of etching is not particularly distinguished, and is simply referred to as etching.

Figure 5:
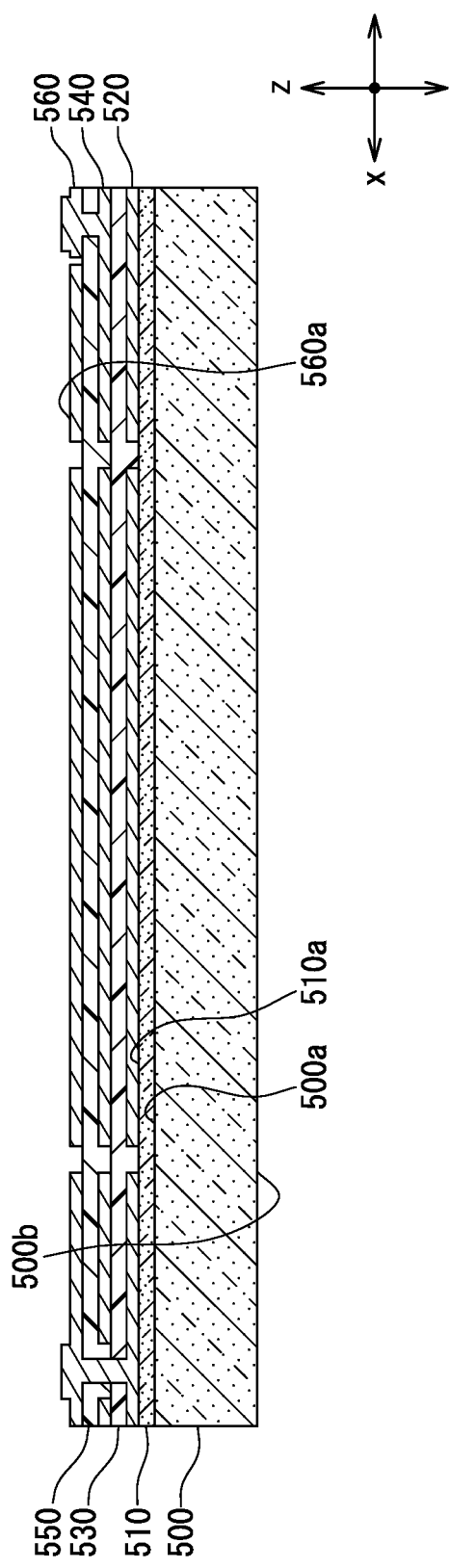
FIG. 5 is a cross-sectional view that illustrates stacking layers of a thin film.

First, a wafer 500 is prepared as illustrated in FIG. 5. The wafer 500 includes a front surface 500a and a rear surface 500b aligned in the z-direction. Impurities such as boron are added to the surface layer of the front surface 500a.

As illustrated in FIG. 5, a design thin film 510 made of silicon oxide is formed at the front surface 500a of the wafer 500. A first electrode thin film 520, a first piezoelectric thin film 530, a second electrode thin film 540, a second piezoelectric thin film 550 and a third electrode thin film 560 are stacked in order in the z-direction at a side closer to an upper surface 510a of the design thin film 510.

These three electrode thin films are patterned. Through the patterning, the three electrode thin films are branched into electrically independent conduction path at the plane orthogonal to the z-direction. Through the etching and film formation, at least a portion of the three electrode thin films is partially conductive in the z-direction. As a result, the extraction electrode 250 is formed.

Figure 6:
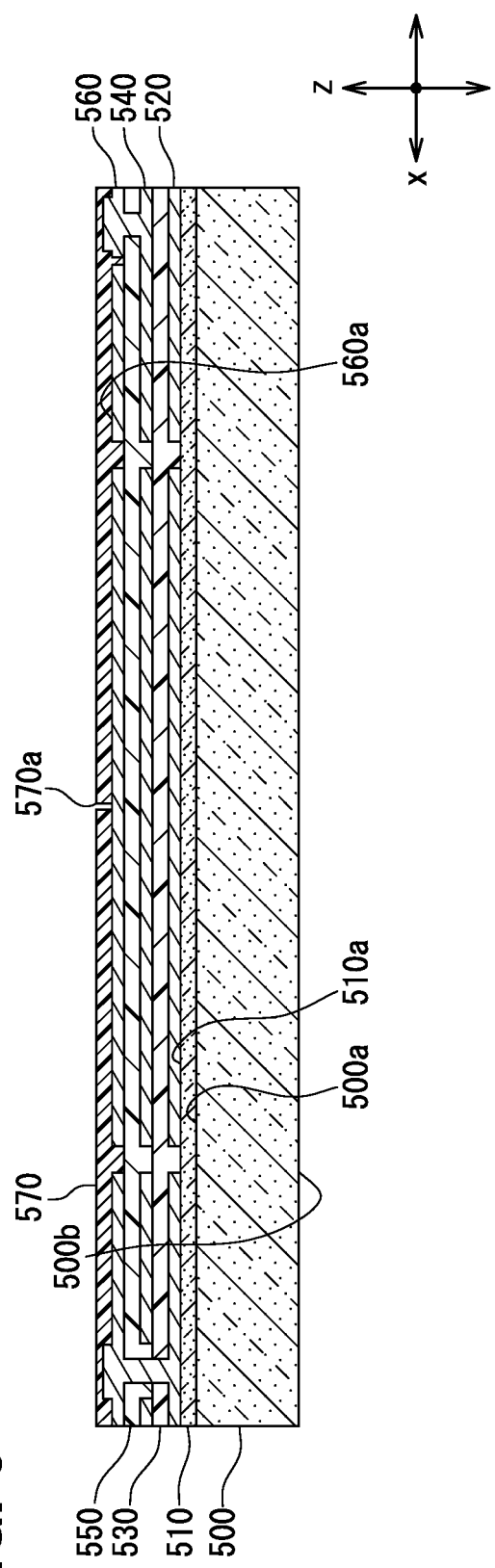
FIG. 6 is a cross-sectional view that illustrates a resist.

Subsequently, as illustrated in FIG. 6, a resist 570 is formed at a side closer to the upper surface 560a of the third electrode thin film 560. The resist 570 may also be referred to as a resist layer. A slit 570a is formed at the resist 570. The slit 570a may also be referred to as a cut or a gap.

Subsequently, as illustrated in FIG. 7, the etching is performed through the slit 570a. As a result, the slit is formed in order to divide the first electrode thin film 520, the first piezoelectric thin film 530, the second electrode thin film 540, the second piezoelectric thin film 550 and the third electrode thin film 560 into multiple vibrators 220. As a result, the side surface 220f is formed.

By etching through the slit 570a, the end portion of each of the first electrode thin film 520, the second electrode thin film 540 and the third electrode thin film 560 is removed in a direction orthogonal to the z-direction. As a result, the groove portion 270 is formed at the side surface 220f.

Subsequently, as illustrated in FIG. 8, the resist 570 is removed, and material adopted for forming the reinforcing film 260 having fluidity is coated at the upper surface 560a of the third electrode thin film 560. The material adopted for forming the reinforcing film 260 is also coated at the side surface 220f. The material adopted for forming the reinforcing film 260 is filled in a portion of the gap. Subsequently, the material adopted for forming the reinforcing film 260 is solidified. As a result, the reinforcing film 260 is formed at a side closer to the upper surface 560a and at a side closer to the side surface 220f, in other words, the groove portion 270. The reinforcing film 260 formed at these locations are integrally connected.

Finally, the wafer 500 and the design thin film 510 are selectively removed from a side closer to the rear surface 500b of the wafer 500. The wafer 500 is divided into multiple MEMS device 200 by, for example, dicing. As a result, the vibrator 220 and the support base 210 are formed as illustrated in FIG. 3.

The wafer 500 is formed to the base portion 211 by the processing described above. The design thin film 510 is formed to the design layer 212. The first electrode thin film 520 is formed to the first electrode layer 241. The first piezoelectric thin film 530 is formed to first piezoelectric layer 231. The second electrode thin film 540 is formed to the second electrode layer 242. The second piezoelectric thin film 550 is formed to the second piezoelectric layer 232. The third electrode thin film 560 is formed to the third electrode layer 243.

Advantageous Effects

The reinforcing film 260 is formed at the vibrator 220. A portion of the reinforcing film 260 is provided at the groove portion 270. The strength of the vibrator 220 is reinforced by the reinforcing film 260. In addition, it is possible to prevent the situation in which the reinforcing film 260 is peeled off from the vibrator 220.

The strength of the vibrator 220 is reinforced. As a result, the vibrator 220 is prevented from warping in the z-direction. The widening of the gap between two vibrators 220 that are aligned and adjacent to each other is suppressed. As a result, it is possible to suppress a decrease in the sensitivity of detecting the acoustic pressure.

The reinforcing film 260 is connected to the upper surface 220d of the groove portion 270 and the side surface 220f. The upper surface 220d has an aperture, and the side surface 220f partitions the groove portion 270 into several regions. Therefore, it is possible to prevent the situation in which the reinforcing film 260 is peeled off from the vibrator, because of the anchor effect between the reinforcing film 260 and the vibrator 220. In the present embodiment, the side surface 220f corresponds to a partition surface or a boundary surface.

The portion of the side surface 220f formed by the three electrode layers is locally hollow; and the portion of the side surface 220f formed by the two piezoelectric layers is relatively protruded, and thus the groove portion 270 is formed. The reinforcing film 260 is formed at the groove portion 270. Thus, the anchor effect is generated between the reinforcing film 260 and the side surface 220f, which partitions the groove portion 270 into several regions. The peeling of the reinforcing film 260 from the groove portion 270 can be inhibited.

The material adopted for forming the reinforcing film 260 contains filler that reduces the difference between the linear expansion coefficient of the organic material and the linear expansion coefficient of the material for making the vibrator 220. Therefore, it is possible to inhibit the generation of stress caused by the difference between both of the linear expansion coefficients at the boundary surface between the reinforcing film 260 and the vibrator 220. In addition, it is possible to prevent the situation in which the reinforcing film 260 is peeled off from the vibrator 220 caused by this stress.

The extraction electrode 250 is connected to the electrode layer 240 formed at a side closer to the support end portion 221. The electrode layer 240 formed at a side closer to the free end portion 222 is not electrically connected to the electrode layer 240 formed at a side closer to the support end portion 221.

As described above, in the support end portion 221 and the free end portion 222, the electrode layer 240 formed at the support end portion 221 outputs the voltage generated by the piezoelectric layer 230. The electrode layer 240 and the piezoelectric layer 230 formed at the support end portion 221 are adopted for detecting the acoustic pressure. However, the electrode layer 240 and the piezoelectric layer 230 formed at the free end portion 222 are not adopted for detecting the acoustic pressure. The groove portion 270 is formed at the free end portion 222.

Due to the groove portion 270, it is possible to inhibit the occurrence of unintended strain in the piezoelectric layer 230 and the electrode layer 240 adopted for detecting the acoustic pressure. It is possible to suppress a decrease in the precision of detecting the acoustic pressure due to the strain.

Four vibrators 220 are cross-linked by the reinforcing film 260 which is shared by four vibrators 220. A portion of the gap formed among the vibrators 220 is closed by the reinforcing film 260. Thus, it is possible to suppress the enlargement of the gap due to the warp on the vibrator 220.

The tip 220c of each of the vibrators 220 is reinforced by the reinforcing film 260. The tip 220c of each of the vibrators 220 at the gap is covered by the reinforcing film 260. Thus, it is possible to suppress the enlargement of the gap due to the warp on the tip 220c of the vibrator 220.

Second Embodiment

The following describes a second embodiment with reference to FIGS. 9 to 12.

The first embodiment describes that a recess part of the groove portion 270 is formed at each of the first electrode layer 241, the second electrode layer 242 and the third electrode layer 243. In the present embodiment, the recess part of the groove portion 270 is formed only at the second electrode layer 242 as one of these three electrode layers.

The material adopted for forming the second electrode layer 242 is different from the material adopted for forming the first electrode layer 241. The second electrode layer 242 may be formed as a portion of the capacitor described in the first embodiment, or may not be formed as a portion of the capacitor. The number of the electrode layers included in the capacitor may be two or more. The electrode layers are spaced apart in the z-direction. The above structure can be formed by adopting the following manufacturing method.

For example, as illustrated in FIG. 10, by the etching of the resist 570 through the slit 570a, a slit is formed at each of the first electrode thin film 520, the first piezoelectric thin film 530, the second electrode thin film 540, the second piezoelectric thin film 550 and the third electrode thin film 560.

Subsequently, as illustrated in FIG. 11, by etching through the slit 570a, the end portion of the second electrode thin film 540 as one of the three electrode thin films is removed in a direction orthogonal to the z-direction. Such etching can be achieved by, for example, an etching solution having a higher etching rate for the second electrode thin film 540 than the first electrode thin film 520 and the third electrode thin film 560. As a result, the recess part of the groove portion 270 is formed at the second electrode thin film 540. The respective end portions of the first electrode thin film 520 and the third electrode thin film 560 are also slightly removed by the etching.

Subsequently, as illustrated in FIG. 12, the resist 570 is removed, and the reinforcing film 260 is formed at a side closer to the upper surface 560a of the third electrode thin film 560 and at a side closer to the side surface 220f. Subsequently, the rear surface 500b of the wafer 500 is selectively removed, and the wafer 500 is cut into multiple MEMS devices 200. As a result, the vibrator 220 and the support base 210 are formed as illustrated in FIG. 9.

The MEMS device 200 described in the present embodiment includes the configuration elements similar to the ones in the MEMS device 200 described in the first embodiment. Therefore, the MEMS device 200 according to the present embodiment generates the advantageous effect similar to the one generated by the MEMS device 200 described in the first embodiment. Therefore, the description related to the operation effects is omitted in this embodiment. Additionally, the description related to the operation effect which is also generated in the following embodiments is also omitted.

Third Embodiment

The following describes a third embodiment with reference to FIGS. 13 to 18.

The first embodiment describes that the amount removed by etching for forming the groove portion 270 is the same for multiple electrode films. As a result, the groove portion 270 includes multiple recesses respectively having identical depths in a direction orthogonal to the z-direction.

In contrast, in the present embodiment, the amount removed by etching for forming the groove portion 270 differs in each of the electrode thin films. The multiple piezoelectric films are also removed by etching, and the amount removed by etching differs in each of the piezoelectric thin films.

Figure 13:
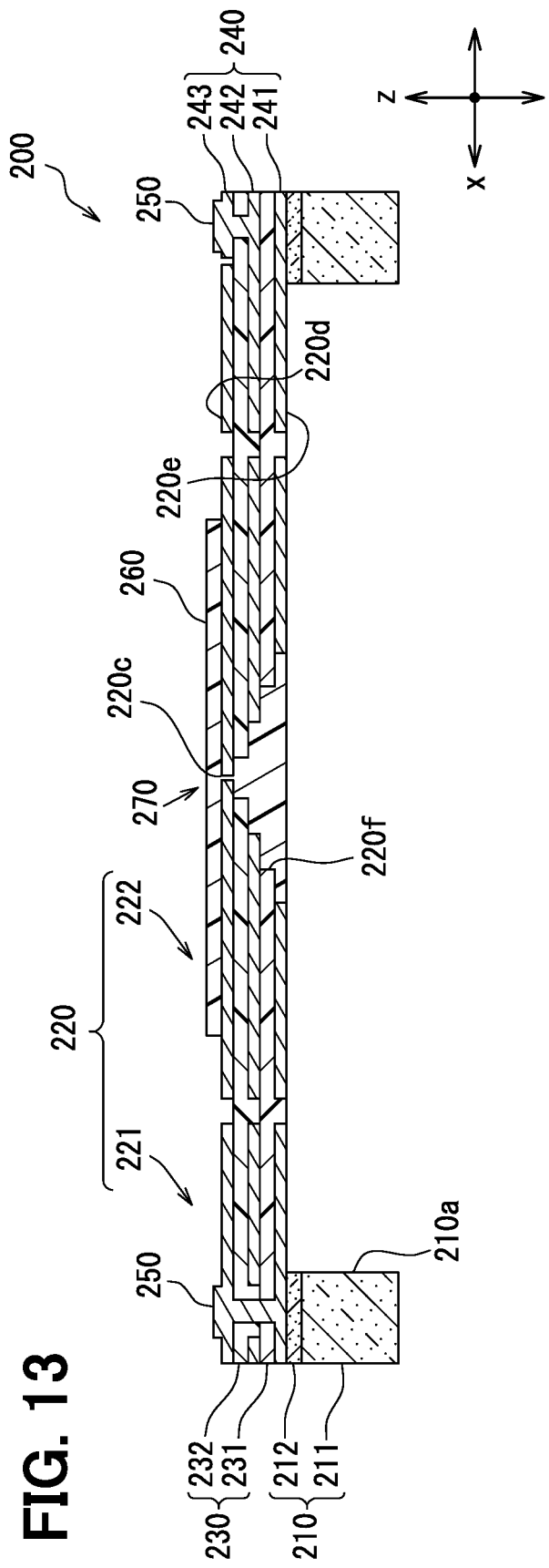
FIG. 13 is a cross-sectional view that illustrates etching of a wafer in a third embodiment.

As illustrated in FIG. 13, the gap is opened to the upper surface 220d and the lower surface 220e. The groove portion 270 is formed at the side surface 220f, which defines the outline or the boundary of the gap. The groove portion 270 has a length in a direction orthogonal to the z-direction that becomes longer toward the lower surface 220e from the upper surface 220d in the z-direction.

The end portion of the multiple electrode layers and the multiple piezoelectric layers at a side closer to the side surface 220f is removed. However, the removal amount differs in each of the layers. The removal amount increases in order from the third electrode layer 243, the second piezoelectric layer 232, the second electrode layer 242, the first piezoelectric layer 231 and the first electrode layer 241.

Figure 14:
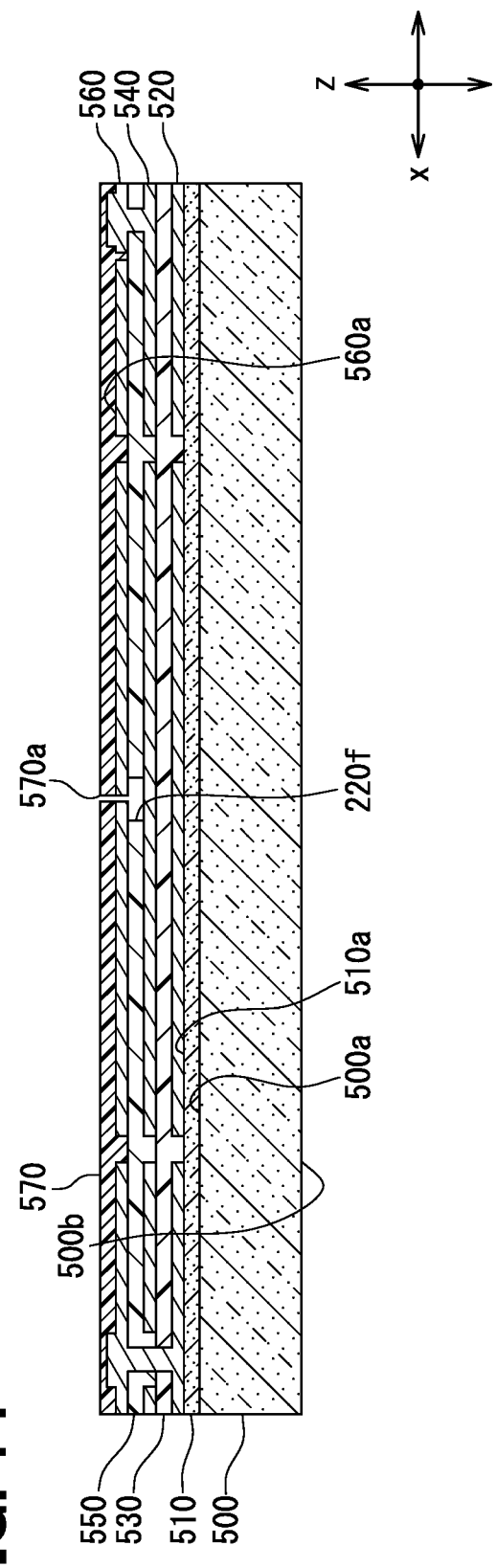
FIG. 14 is a cross-sectional view that illustrates light exposure and etching.

For example, as illustrated in FIG. 14, the slit is formed at each of the third electrode thin film 560 and the second piezoelectric thin film 550 by etching through the slit 570a of the resist 570. By etching, the end portion of the second piezoelectric thin film 550 at a side closer to the side surface 220f is removed in a direction orthogonal to the z-direction.

Subsequently, as illustrated in FIG. 15, the end portion of the second electrode thin film 540 at a side closer to the side surface 220f is removed in a direction orthogonal to the z-direction by etching. The amount of the second electrode thin film 540 is removed more than the amount of the second piezoelectric thin film 550. At this time, a protection film (not shown) is formed at the third electrode thin film 560 and the second piezoelectric thin film 550 at a side closer to the side surface 220f.

Subsequently, as illustrated in FIG. 16, the end portion of the first piezoelectric thin film 530 at a side closer to the side surface 220f is removed in a direction orthogonal to the z-direction by etching. The amount of the first piezoelectric thin film 530 is removed more than the amount of the second electrode thin film 540. At this time, the protection film (not shown) is formed at the third electrode thin film 560, the second piezoelectric thin film 550 and the second electrode thin film 540 at a side closer to the side surface 220f.

Subsequently, as illustrated in FIG. 17, the end portion of the first electrode thin film 520 at a side closer to the side surface 220f is removed in a direction orthogonal to the z-direction by etching. The amount of the first electrode thin film 520 is removed more than the amount of the second piezoelectric thin film 550. At this time, the protection film (not shown) is formed at the third electrode thin film 560, the second piezoelectric thin film 550, the second electrode thin film 540 and the first piezoelectric thin film 530 at a side closer to the side surface 220f. Then, the resist 570 and the protective film are removed. Although the resist 570 is illustrated in FIGS. 15 to 17, the protective film for protecting from etching is formed at the third electrode thin film 560 instead of the resist 570.

Subsequently, as illustrated in FIG. 18, the reinforcing film 260 is formed at each of the upper surface 560a of the third electrode thin film 560, the side surface 220f, and the groove portion 270. The rear surface 500b of the wafer 500 is selectively removed, and the wafer 500 is cut into multiple MEMS devices 200. As a result, the vibrator 220 and the support base 210 are formed as illustrated in FIG. 13.

As described above, the groove portion 270 has a length in a direction orthogonal to the z-direction that increases toward the lower surface 220e from the upper surface 220d. The reinforcing film 260 is connected to the side surface 220f included in the groove portion 270. The reinforcing film 260 is connected to the upper surface 220d.

As a result, it is possible to effectively prevent the situation in which the reinforcing film 260 is peeled off from the vibrator 220, through the exertion of the force in the direction toward the upper surface 220d from the lower surface 220e. The z-direction corresponds to a thickness direction. The length in a direction orthogonal to the z-direction corresponds to a transverse direction, a lateral direction, or a horizontal direction.

Fourth Embodiment

Figure 19:
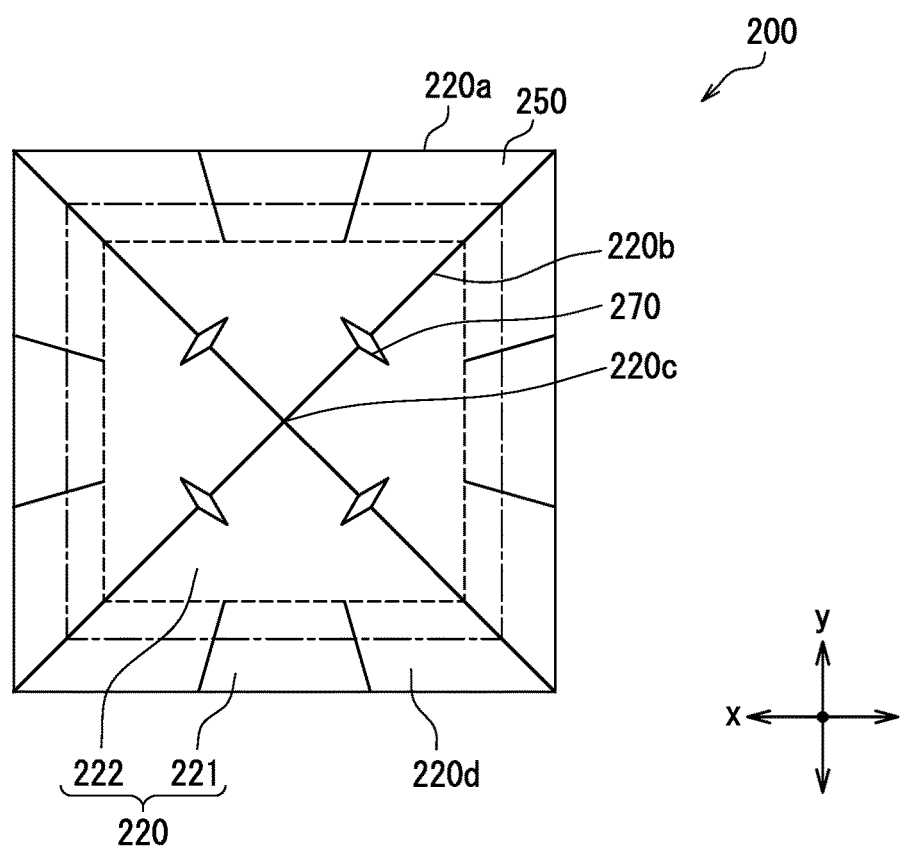
FIG. 19 is a top view of a MEMS device in a fourth embodiment.
Figure 20:
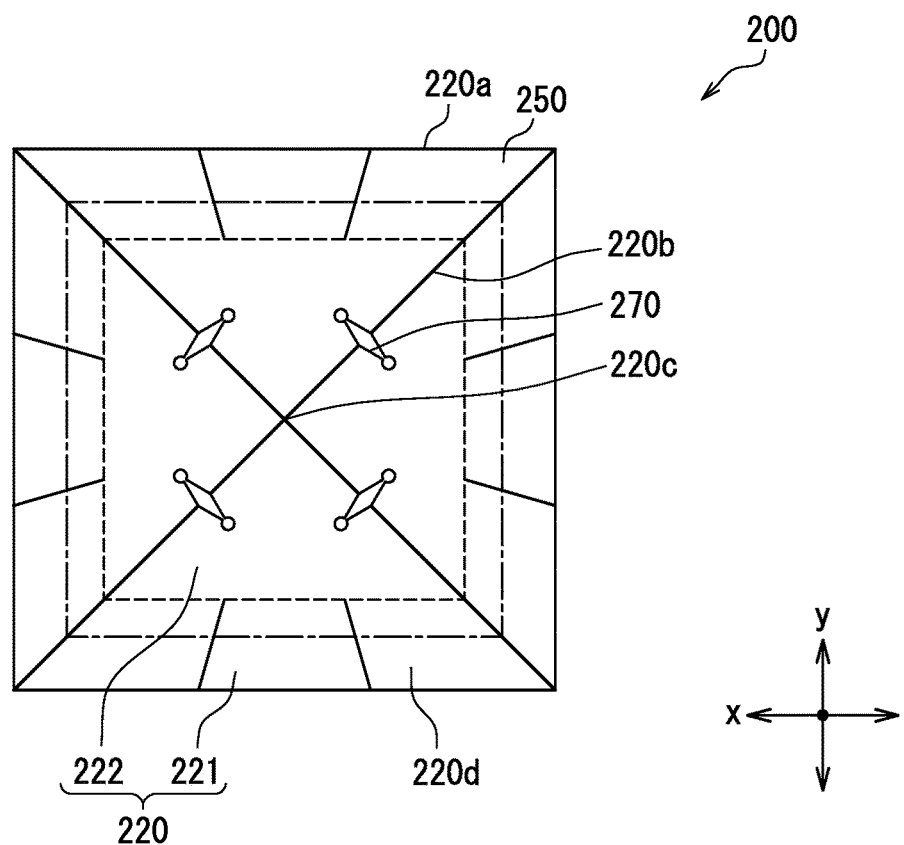
FIG. 20 is a top view of the MEMS device.
Figure 21:
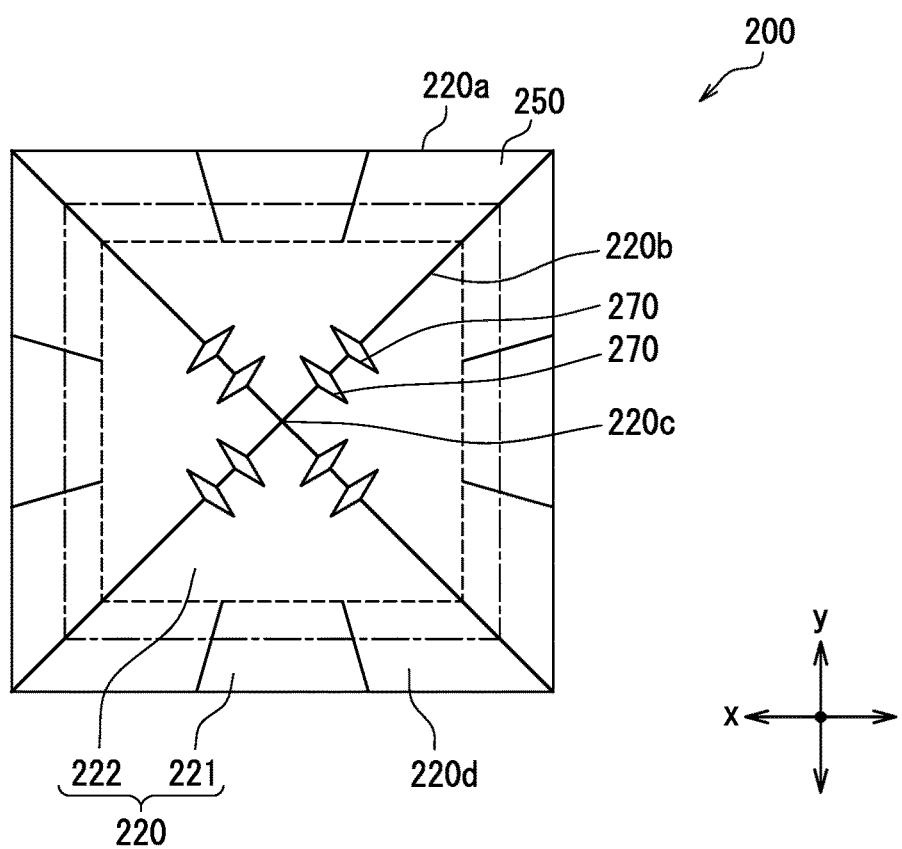
FIG. 21 is a top view of the MEMS device.

The following describes a fourth embodiment with reference to FIGS. 19 to 21. Each of FIGS. 19 to 21 omits the illustration of the reinforcing film 260.

The first embodiment describes the groove portion 270 is formed at the side surface 220f of the free end portion 222 at a side closer to the tip 220c. In contrast, in the present embodiment, for example, the groove portion 270 is formed at the side surface 220f of the free end portion 222 at a side closer to the support end portion as illustrated in FIG. 19.

In the present embodiment, the groove portion 270 is independently formed at each of the two side surfaces 220f included in each of four vibrators 220. The groove portions 270 are independently formed at two side surfaces 220f of respective two of the four vibrators 220 adjacent to each other and aligned in the circumferential direction. The groove portions 270 are aligned in the circumferential direction. The respective shapes of these two groove portions 270 form a parallelogram. Each of the shapes is surrounded by the extension of the outer contour line at a plane orthogonal to the z-direction. The ratio of the lengths of the respective diagonal lines connecting the two sets of corners of the parallelogram is set to 1:2 or larger. In other words, the ratio of the width to the length of the groove portion 270 is 1:2 or larger.

The shape surrounded by the extension of the outer contour lines of the two groove portions 270 aligned adjacent to each other in the circumferential direction is not limited a specific shape such as parallelogram.

For example, the planar shape of each of the corners of the parallelogram in a single groove portion 270 may be circular, as illustrated in FIG. 20. Therefore, the groove portion 270 is easily filled with the reinforcing film 260. The planar shape of the groove portion 270 can be appropriately determined according to, for example, the ease of filling the reinforcing film 260 and the strength of the anchoring effect between the reinforcing film 260 and the groove portion 270.

The number of the groove portions 270 formed in a single vibrator 220 is not particularly limited. Two groove portions 270 may be formed in a single vibrator 220 as illustrated in FIG. 19. Four groove portions 270 may be formed in a single vibrator 220 as illustrated in FIG. 21.

Fifth Embodiment

Figure 22:
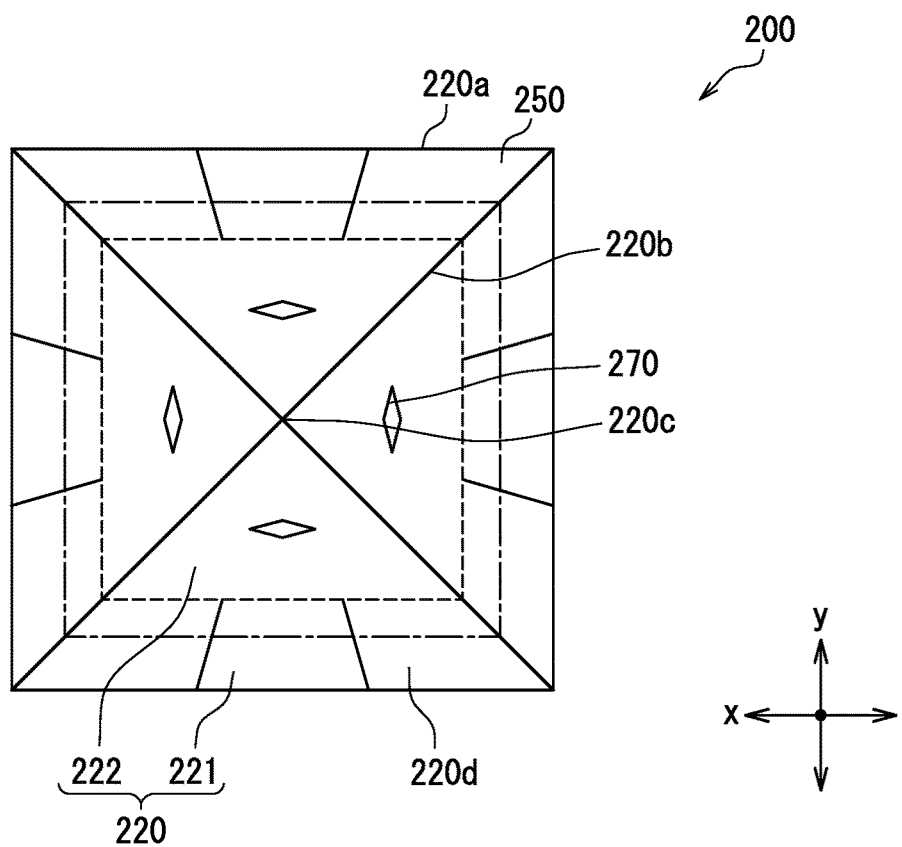
FIG. 22 is a top view of a MEMS device in a fifth embodiment.
Figure 23:
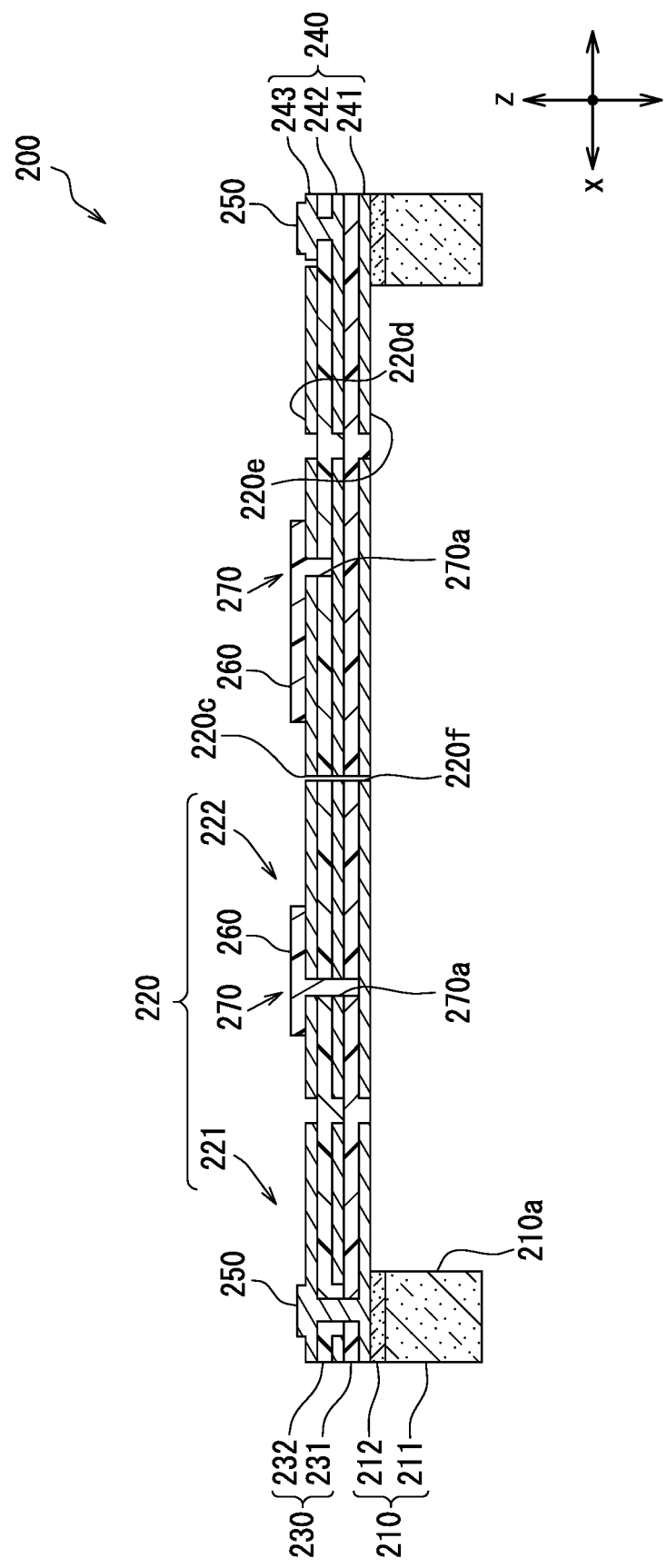
FIG. 23 is a cross-sectional view of the MEMS device.

The following describes a fifth embodiment with reference to FIGS. 22, 23. FIG. 22 omits the illustration of the reinforcing film 260.

The first embodiment describes that the groove portion 270 is formed at the side surface 220f of the vibrator 220. Therefore, the first embodiment shows that the groove portion 270 divides a part of the gap into several regions. In contrast, in the present embodiment, the groove portion 270 is formed at a location different from the side surface 220f of the vibrator 220 as illustrated in, for example, FIG. 22. The boundary of the groove portion 270 is defined by a concave surface 270a. The concave surface 270a corresponds to a boundary surface.

The groove portion 270 has an aperture that opens toward the upper surface 220d. The shape of the aperture is a parallelogram. However, the shape of the aperture is not particularly limited. Assuming that n is an integer of 3 or larger, an n-sided polygon may also be adopted as the shape of the aperture. An ellipse may also be adopted as the shape of the aperture.

Although the groove portion 270 has the aperture toward the upper surface 220d of the vibrator 220 as illustrated in, for example, FIG. 23, the groove portion 270 is closed at a side closer to the lower surface 220e. However, the groove portion 270 may also have an aperture that opens toward the lower surface 220e.

The respective lengths of the groove portions 270 in the z-direction independently formed at the vibrators 220 may be different as illustrated in, for example, FIG. 23. The respective lengths of the groove portions 270 in the z-direction independently formed at the vibrators 220 may be identical.

The first embodiment describes that a single reinforcing film 260 is commonly formed at the vibrators 220. However, multiple reinforcing films 260 may also be individually formed at the respective vibrators 220.

The first embodiment describes that a portion of the gap formed among the vibrators 220 is closed by the reinforcing film 260. However, the entire gap may not be closed by the reinforcing film 260 as illustrated in, for example, FIG. 23.

Sixth Embodiment

Figure 24:
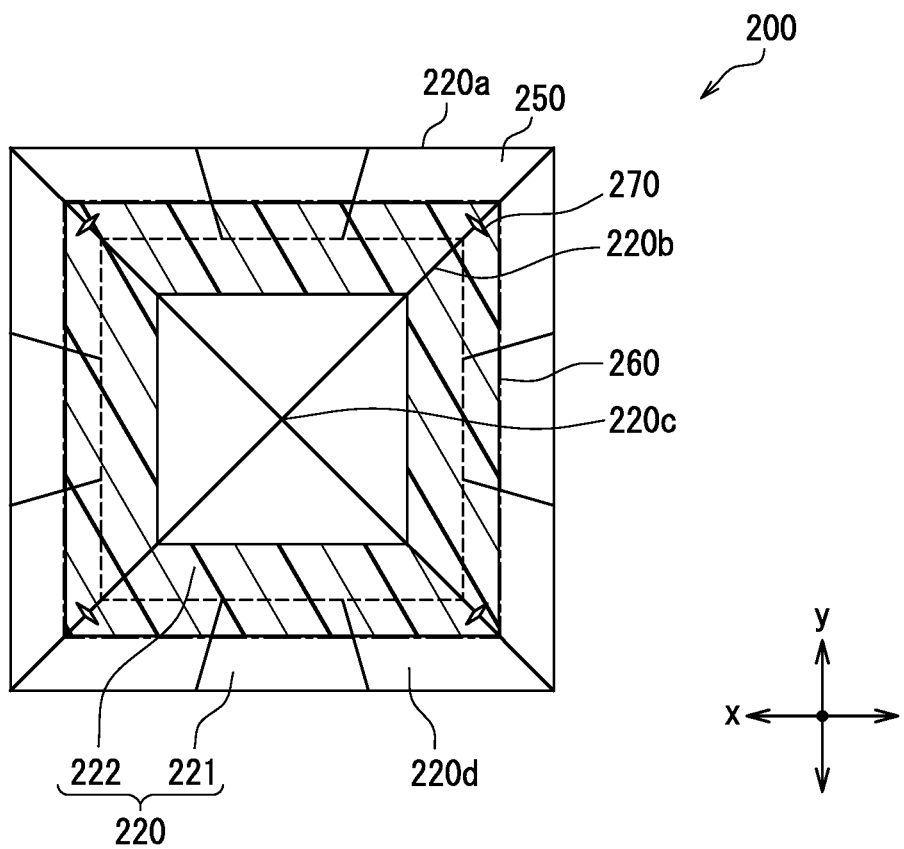
FIG. 24 is a top view of a MEMS device in a sixth embodiment.

The following describes a sixth embodiment with reference to FIG. 24.

The first embodiment describes that the reinforcing film 260 is formed at the free end portion 222. In contrast, in the present embodiment, for example, the reinforcing film 260 is formed at the free end portion 222 and the support end portion 221. The groove portion 270 is formed at the support end portion 221.

The support end portion 221 tends to bend due to the groove portion 270. Therefore, it is anticipated that the sensitivity of detecting the acoustic pressure enhances. The reinforcing film 260 may be formed only at the support end portion 221 as one of the free end portion 222 and the support end portion 221. The size of the formation region of the reinforcing film 260 at the free end portion 222 and the support end portion 221 may be identical or different.

The first embodiment describes that the planar shape of the reinforcing film 260 orthogonal to the z-direction is rectangular. However, the planar shape of the reinforcing film 260 is not particularly limited. For example, the planar shape of the reinforcing film 260 may also be a loop shape as illustrated in FIG. 24. Although not shown in particular, the planar shape of the reinforcing film 260 may be, for example, a circular shape, an elliptical shape, and a polygonal shape.

Seventh Embodiment

Figure 25:
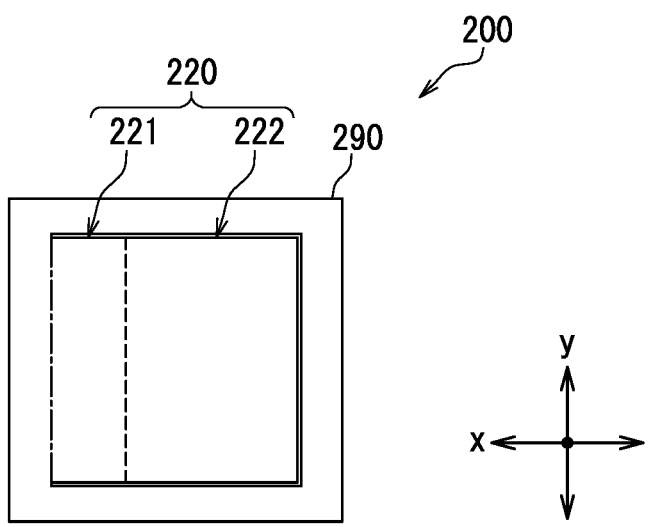
FIG. 25 is a top view of a MEMS device in a seventh embodiment.

The following describes a seventh embodiment with reference to FIG. 25. FIG. 25 omits the illustration of the reinforcing film 260 and the groove portion 270.

The first embodiment describes that the gap is formed among the vibrators 220. In contrast, the MEMS device 200 according to the present embodiment includes a regulating portion 290 made of the material of the vibrator 220. The vibrator 220 supported at the support base 210 in a cantilevered form is surrounded by the regulating portion 290. A gap is formed between the vibrator 220 and the regulating portion 290.

The first embodiment describes that the vibrator 220 is formed in a tapered triangular shape. In contrast, the vibrator 220 according to the present embodiment is formed in a rectangular shape.

The first embodiment describes that the number of the vibrators 220 is four. In contrast, the number of the vibrator 220 is one.

Although not shown, the number of the vibrators 220 may also be two. The gap is formed between two vibrators 220, and between the vibrator 220 and the regulating portion 290. The number of vibrators 220 is not particularly limited.

The reinforcing film 260 and the groove portion 270 are formed also at the vibrator 220 according to the present embodiment. As a result, it is possible to prevent the situation in which the reinforcing film 260 is peeled off from the vibrator 220.

Although the present disclosure has been described in accordance with the examples, it is understood that the present disclosure is not limited to such examples or structures. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A microelectromechanical systems device comprising:
a vibrator including a piezoelectric element configured to convert pressure to an electrical signal; and
a reinforcing film configured to reinforce strength of the vibrator,
wherein the vibrator further includes a groove at which a portion of the reinforcing film is disposed,
wherein the vibrator further includes:
a front surface that has an aperture of the groove; and
a boundary surface that defines a boundary of the groove,
wherein the reinforcing film is connected to the front surface and the boundary surface,
wherein the vibrator further includes a rear surface at a rear side of the vibrator facing the front surface,
wherein at least one section of the groove has a length in a lateral direction orthogonal to a thickness direction connecting the front surface and the rear surface, and
wherein the length increases in a stepwise manner toward the rear surface from the front surface.

2. The microelectromechanical systems device according to claim 1,
wherein material of the reinforcing film includes organic material and filler, and
wherein the filler reduces difference between a linear expansion coefficient of the organic material and a linear expansion coefficient of material included in the vibrator.

3. The microelectromechanical systems device according to claim 1,
wherein the vibrator further includes:
a support end portion that has a section fixed to a support base; and
a free end portion that is integrally connected to the support end portion,
wherein the groove is disposed at the free end portion, and
wherein the reinforcing film is disposed at the free end portion.

4. The microelectromechanical systems device according to claim 3,
wherein the piezoelectric element included in the support end portion and the piezoelectric element included in the free end portion are insulated to each other,
wherein the vibrator further includes an electrode configured to connect an external device and the piezoelectric element included in the support end portion, and
wherein the electrode is disposed at the support end portion at a side closer to the support base.

5. The microelectromechanical systems device according to claim 4,
wherein the vibrator includes a plurality of vibrators,
wherein the free end portion includes a plurality of free end portions that are respectively included in the vibrators,
wherein the free end portions respectively have first ends and second ends, and the first ends are respectively separated from the second ends,
wherein the free end portions respectively have a plurality of tips correspondingly located at the second ends,
wherein the support end portion is located at each of the first ends,
wherein the free end portions are respectively tapered from the first ends to the second ends, and
wherein the tips respectively located at the second ends are linked through the reinforcing film.

6. The microelectromechanical systems device according to claim 1,
wherein the vibrator includes a plurality of vibrators,
wherein a gap for relieving acoustic pressure as the pressure is disposed among the vibrators, and
wherein a portion of the gap is closed by the reinforcing film.

7. A microelectromechanical systems device comprising:
a vibrator including a piezoelectric element configured to convert pressure to an electrical signal; and
a reinforcing film configured to reinforce strength of the vibrator,
wherein the vibrator further includes a groove at which a portion of the reinforcing film is disposed,
wherein the vibrator further includes:
a support end portion that has a section fixed to a support base; and
a free end portion that is integrally connected to the support end portion,
wherein the groove is disposed at the free end portion,
wherein the reinforcing film is disposed at the free end portion, wherein the piezoelectric element included in the support end portion and the piezoelectric element included in the free end portion are insulated to each other, wherein the vibrator further includes an electrode configured to connect an external device and the piezoelectric element included in the support end portion, wherein the electrode is disposed at the support end portion at a side closer to the support base, wherein the vibrator includes a plurality of vibrators, wherein the free end portion includes a plurality of free end portions that are respectively included in the vibrators, wherein the free end portions respectively have first ends and second ends, and the first ends are respectively separated from the second ends, wherein the free end portions respectively have a plurality of tips correspondingly located at the second ends, wherein the support end portion is located at each of the first ends, wherein the free end portions are respectively tapered from the first ends to the second ends, and wherein the tips respectively located at the second ends are linked through the reinforcing film.

\* \* \* \* \*

UNITED STATES PATENT AND TRADEMARK OFFICE
CERTIFICATE OF CORRECTION

PATENT NO. : 12,294,832 B2  
APPLICATION NO. : 17/843220  
DATED : May 6, 2025  
INVENTOR(S) : Yuki Ohara et al.

Page 1 of 1

It is certified that error appears in the above-identified patent and that said Letters Patent is hereby corrected as shown below:

On the Title Page

Item (73) (Assignees):
Change the first Assignee from DENSO CORPORATION, Kariya (CN) to DENSO CORPORATION, Kariya (JP).

Signed and Sealed this  
Tenth Day of June, 2025

Coke Morgan Stewart  
*Acting Director of the United States Patent and Trademark Office*